(12) United States Patent
Kang et al.

(10) Patent No.: US 12,243,953 B2
(45) Date of Patent: Mar. 4, 2025

(54) APPARATUS FOR MANUFACTURING LIGHT-EMITTING DISPLAY DEVICE

(71) Applicant: SAMSUNG DISPLAY CO., LTD., Yongin-si (KR)

(72) Inventors: Jong Hyuk Kang, Yongin-si (KR); Won Ho Lee, Yongin-si (KR); Hyun Deok Im, Yongin-si (KR); Young Hoi Kim, Yongin-si (KR); Jin Young Kim, Yongin-si (KR); Hyun Min Cho, Yongin-si (KR); Hae Yun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 872 days.

(21) Appl. No.: 17/255,795

(22) PCT Filed: Feb. 7, 2019

(86) PCT No.: PCT/KR2019/001545
§ 371 (c)(1),
(2) Date: Dec. 23, 2020

(87) PCT Pub. No.: WO2020/004762
PCT Pub. Date: Jan. 2, 2020

(65) Prior Publication Data
US 2021/0126158 A1   Apr. 29, 2021

(30) Foreign Application Priority Data

Jun. 27, 2018   (KR) .................. 10-2018-0073900
Sep. 14, 2018   (KR) .................. 10-2018-0110420

(51) Int. Cl.
*H01L 33/00*   (2010.01)
*H01L 25/075*   (2006.01)

(52) U.S. Cl.
CPC ...... *H01L 33/0095* (2013.01); *H01L 25/0753* (2013.01)

(58) Field of Classification Search
CPC . B41J 11/002; B41J 3/407; H01L 2224/7525; H01L 2224/75251;
(Continued)

(56) References Cited

U.S. PATENT DOCUMENTS 7,008,811 B2   3/2006   Park et al.
7,111,755 B2   9/2006   Koyama et al.
(Continued)

FOREIGN PATENT DOCUMENTS

CN   1653620   8/2005
CN   107584885   1/2018
(Continued)

OTHER PUBLICATIONS

International Search Report, with English translation, corresponding to International Application No. PCT/ KR2019/001545 dated May 17, 2019.
(Continued)

*Primary Examiner* — Minh N Trinh
(74) *Attorney, Agent, or Firm* — KILE PARK REED & HOUTTEMAN PLLC

(57) ABSTRACT

An apparatus for manufacturing a light emitting display device includes a stage, and at least one electric-field application module disposed on at least one side of the stage. The apparatus further includes at least one of: at least one printing head disposed above the stage, and a heating element disposed adjacent the stage. The at least one electric-field application module includes a probe head having at least one probe pin, and a driver connected to the probe head to move the probe head.

23 Claims, 30 Drawing Sheets

(58) Field of Classification Search
CPC . H01L 2224/75252; H01L 2224/75655; H01L 2224/757; H01L 2224/75804
See application file for complete search history.

(56) References Cited

U.S. PATENT DOCUMENTS

| | | |
|---|---|---|
| 8,877,636 B1 | 11/2014 | Hunter et al. |
| 9,181,630 B2 | 11/2015 | Shibata et al. |
| 9,525,030 B2 | 12/2016 | Hwang et al. |
| 10,249,603 B2 | 4/2019 | Cho et al. |
| 10,340,419 B2 | 7/2019 | Kim et al. |
| 10,438,834 B2 | 10/2019 | Matsuura et al. |
| 10,453,695 B2 | 10/2019 | Eto et al. |
| 10,910,251 B2 | 2/2021 | Matsuura et al. |
| 11,005,009 B2 | 5/2021 | Kim et al. |
| 11,600,472 B2 | 3/2023 | Isomura et al. |
| 11,685,154 B2 | 6/2023 | Lee et al. |
| 11,728,196 B2 | 8/2023 | Lee et al. |
| 2003/0108804 A1 | 6/2003 | Cheng et al. |
| 2006/0263705 A1 | 11/2006 | Kim et al. |
| 2007/0184363 A1 | 8/2007 | Kim et al. |
| 2013/0168708 A1 | 7/2013 | Shibata et al. |
| 2015/0276639 A1 | 10/2015 | Spath et al. |
| 2017/0136700 A1 | 5/2017 | Li et al. |
| 2018/0138157 A1 | 5/2018 | Im et al. |
| 2021/0090929 A1 | 3/2021 | Yang et al. |
| 2021/0126158 A1* | 4/2021 | Kang ............... B41J 3/407 |
| 2021/0265529 A1 | 8/2021 | Kim et al. |
| 2021/0320089 A1* | 10/2021 | Kang ............... H05K 13/04 |
| 2022/0165911 A1 | 5/2022 | Kang et al. |
| 2022/0165928 A1 | 5/2022 | Baek et al. |
| 2022/0254657 A1 | 8/2022 | Choi |
| 2022/0254753 A1 | 8/2022 | Lee et al. |
| 2022/0320365 A1 | 10/2022 | Ryu et al. |
| 2022/0352042 A1* | 11/2022 | Lee ............... G09G 3/006 |
| 2022/0388303 A1 | 12/2022 | Cho et al. |
| 2022/0396073 A1 | 12/2022 | Park et al. |
| 2023/0025604 A1 | 1/2023 | Im et al. |
| 2023/0047796 A1 | 2/2023 | Ryu et al. |
| 2023/0145433 A1 | 5/2023 | Kang et al. |
| 2023/0150277 A1 | 5/2023 | Lee et al. |
| 2023/0256735 A1 | 8/2023 | Hong et al. |
| 2023/0268454 A1 | 8/2023 | Han |
| 2023/0286292 A1 | 9/2023 | Lee et al. |

FOREIGN PATENT DOCUMENTS

| | | |
|---|---|---|
| CN | 108389965 | 8/2018 |
| EP | 3 270 413 | 1/2018 |
| EP | 3 270 424 | 1/2018 |
| JP | 2004-90621 | 3/2004 |
| JP | 2006-162290 | 6/2006 |
| JP | 2010-114161 | 5/2010 |
| JP | 2017041290 A * | 2/2017 |
| KR | 10-2001-0054915 | 7/2001 |
| KR | 10-2006-0100600 | 9/2006 |
| KR | 10-2007-0073458 | 7/2007 |
| KR | 10-2007-0079879 | 8/2007 |
| KR | 10-2009-0117023 | 11/2009 |
| KR | 10-2011-0075082 | 7/2011 |
| KR | 10-2011-0078081 | 7/2011 |
| KR | 10-2011-0079024 | 7/2011 |
| KR | 10-2013-0020475 | 2/2013 |
| KR | 10-2013-0033450 | 4/2013 |
| KR | 10-2013-0044790 | 5/2013 |
| KR | 10-1328096 | 11/2013 |
| KR | 10-2014-0063331 | 5/2014 |
| KR | 10-1627365 | 6/2016 |
| KR | 10-1628345 | 6/2016 |
| KR | 10-2018-0007376 | 1/2018 |
| KR | 10-2018-0009014 | 1/2018 |
| KR | 10-2018-0055021 | 5/2018 |
| KR | 10-1987196 | 6/2019 |
| KR | 10-2020-0001656 | 1/2020 |
| KR | 10-2020-0006208 | 1/2020 |
| KR | 10-2020-0006209 | 1/2020 |
| KR | 10-2020-0031743 | 3/2020 |

OTHER PUBLICATIONS

Written Opinion, with English translation, corresponding to International Application No. PCT/KR2019/001545, dated May 17, 2019.

Korean Notice of Allowance for Korean Application 10-2018-0110420, dated Oct. 18, 2023.

Chinese Office Action for Chinese Application No. 201980040773.3, dated Nov. 17, 2023.

International Search Report, with English translation, corresponding to International Application No. PCT/ KR2019/003328 dated Jul. 3, 2019.

Written Opinion, with English translation, corresponding to International Application No. PCT/KR2019/003328, dated Jul. 3, 2019.

Korean Notice of Allowance for Korean Patent Application No. 10-2018-0114425, dated Nov. 20, 2023.

Chinese Office Action for Chinese Patent Application or Patent No. 201980058988.8, dated Jan. 31, 2024.

* cited by examiner

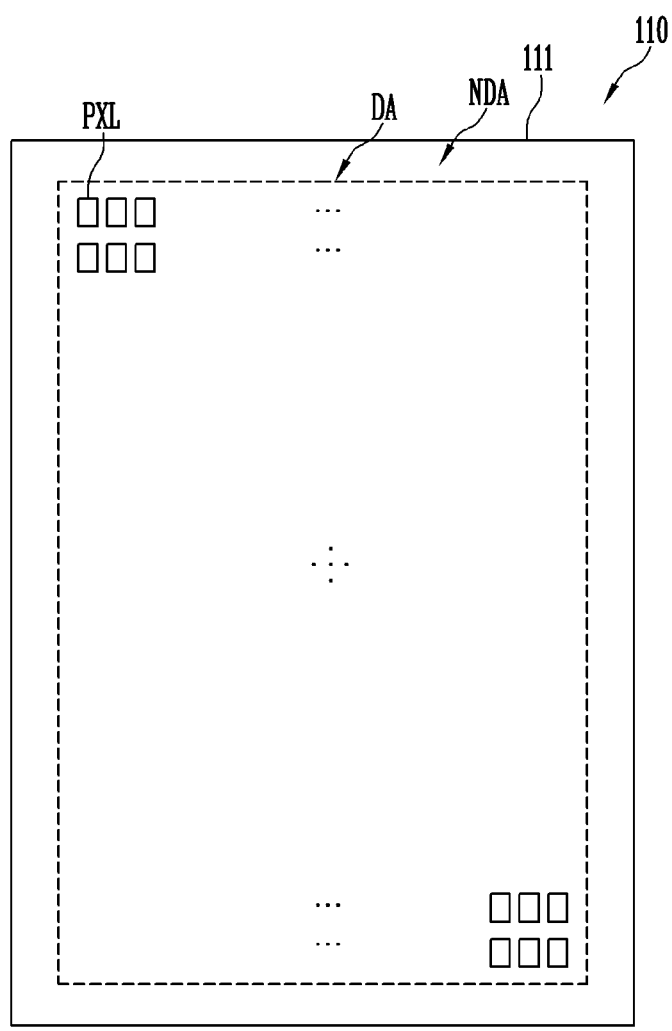

APPARATUS FOR MANUFACTURING LIGHT-EMITTING DISPLAY DEVICE

CROSS-REFERENCE TO RELATED APPLICATION(S)

This application is a national entry of International Application No. PCT/KR2019/001545, filed on Feb. 7, 2019, which claims under 35 U.S.C. § 119(a) and 365(b) priority to and benefits of Korean Patent Application No. 10-2018-0073900 and 10-2018-0110420, filed on Jun. 27, 2018 and Sep. 14, 2018, respectively, in the Korean Intellectual Property Office, the entire contents of which are incorporated herein by reference.

BACKGROUND

1. Technical Field

Various embodiments of the disclosure relate to an apparatus for manufacturing a light emitting display device.

2. Description of the Related Art

A light emitting display device may use a self-emissive element such as a light emitting diode as a light source of a pixel to display a high-quality image. The light emitting diode may maintain relatively satisfactory durability even under poor environmental conditions, and may be excellent in terms of lifetime and luminance.

Recently, research has been conducted on the technology of fabricating a subminiature light emitting diode using material having a high-reliability inorganic crystalline structure, and then disposing the subminiature light emitting diode on a panel (hereinafter, referred to as a "light emitting display panel") of a light emitting display device to use it as a next generation pixel light source. As a part of such research, technology for forming a light source by fabricating a subminiature light emitting diode in a small size corresponding to the micro scale or the nano scale and then disposing the diode in a light emitting area of each pixel is being developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments of the disclosure are directed to an apparatus for manufacturing a light emitting display device, which may allow light emitting elements to be efficiently aligned on a substrate of a light emitting display panel.

According to an aspect of the disclosure, an apparatus for manufacturing a light emitting display device may include a stage; and at least one electric-field application module disposed on at least one side of the stage. The apparatus further includes at least one of: at least one printing head disposed above the stage; and a heating element disposed adjacent the stage. The at least one electric-field application module may include a probe head having at least one probe pin, and a driver connected to the probe head to move the probe head.

In an embodiment, the at least one electric-field application module may include a first electric-field application module disposed on a first side of the stage; and a second electric-field application module disposed on a second side of the stage, the second side of the stage facing the first side of the stage.

In an embodiment, the first electric-field application module and the second electric-field application module may be independently driven.

In an embodiment, the printing head may spray a droplet onto the stage while moving above the stage from the first side of the stage to the second side of the stage.

In an embodiment, the first electric-field application module and the second electric-field application module may be sequentially or alternately driven.

In an embodiment, a probe head of the second electric-field application module may apply an electric field to a substrate disposed on the stage while the printing head is located above the first side of the stage; and a probe head of the first electric-field application module may apply an electric field to the substrate while the printing head is located above the second side of the stage.

In an embodiment, the first electric-field application module and the second electric-field application module may be simultaneously driven.

In an embodiment, the at least one electric-field application module may include at least one of a third electric-field application module disposed on a third side of the stage; and a fourth electric-field application module disposed on a fourth side of the stage, the fourth side of the stage facing the third side of the stage.

In an embodiment, the driver may include a first driver that horizontally moves the probe head forwards and backwards or leftwards and rightwards, and a second driver that vertically moves the probe head up and down.

In an embodiment, the at least one electric-field application module may include at least one sensor that senses a position of the probe head.

In an embodiment, the at least one electric-field application module may include a first sensor that senses a horizontal position of the probe head, the first sensor being disposed adjacent the first driver; and a second sensor that senses a vertical position of the probe head, the second sensor being disposed adjacent the second driver.

In an embodiment, each of the first sensor and the second sensor may include a first position sensor that senses a front limit or a rise limit of the probe head; a second position sensor that senses a rear limit or a drop limit of the probe head; and a third position sensor disposed between the first position sensor and the second position sensor to sense whether the probe head reaches a predetermined target point or height.

In an embodiment, each of the first driver and the second driver may include a motor; and a ball screw connected to the motor.

In an embodiment, the probe head may include at least one first probe pin electrically connected to a first power line, and at least one second probe pin electrically connected to a second power line.

In an embodiment, the apparatus may further include a power supply electrically connected to the at least one first probe pin and the at least one second probe pin through the first power line and the second power line.

In an embodiment, the power supply may supply an alternating current voltage through the first power line to the at least one first probe pin, and the power supply may supply a reference voltage having a predetermined reference potential through the second power line to the at least one second probe pin.

In an embodiment, the at least one printing head may include printing heads that spray solution in which different light emitting elements may be dispersed onto the stage.

In an embodiment, the at least one electric-field application module may further include a body connected to the probe head and the driver, and a linear motion guide connected to the body.

In an embodiment, the stage may include a hot plate including the heating element.

In an embodiment, the heating element may be disposed above and spaced apart from the stage.

An apparatus for manufacturing a light emitting display device in accordance with an embodiment is advantageous in that light emitting elements may be efficiently supplied and aligned on a substrate of a light emitting display panel, and the quality of alignment may be improved.

BRIEF DESCRIPTION OF THE DRAWINGS

The above and other aspects, features, and advantages of embodiments will be more apparent from the following description taken in conjunction with the accompanying drawings, in which:

FIG. 2 is a diagram illustrating a light emitting display panel in accordance with an embodiment.

DETAILED DESCRIPTION OF THE EMBODIMENTS

Figure 1:
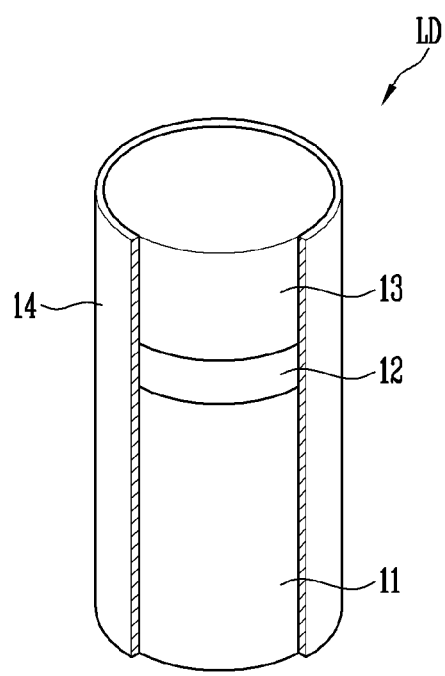
FIG. 1 is a diagram illustrating a light emitting element in accordance with an embodiment.

Reference will now be made in detail to various embodiments, examples of which are illustrated in the accompanying drawings and described below, since the embodiments may be variously modified in many different forms. However, the disclosure is not limited to the following embodiments and may be modified into various forms.

Some elements which are not directly related to the features in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. The above terms are used only to distinguish one component from another. For instance, a first element or component discussed below could be termed a second element or component without departing from the teachings of the disclosure. Similarly, the second element or component could also be termed the first element or component.

The singular forms "a," "an," and "the" as used herein are intended to include the plural forms as well unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first component or part is disposed on a second component or part, the first component or part may be not only directly on the second component or part but a third component or part may intervene between them. Furthermore, the term "position", "direction", etc. used in the following description are defined in relative terms, and it should be noted that they may be changed into a reverse position or direction depending on a view angle or direction.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" or "module" denotes a structure or element as illustrated in the drawings and as described in the specification. However, the disclosure is not limited thereto. The term "unit" or "module" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments and required details are described with reference to the accompanying drawings in order to describe the disclosure in detail so that those having ordinary knowledge in the technical field to which the disclosure pertains may easily practice the disclosure.

FIG. 1 is a diagram illustrating a light emitting element LD in accordance with an embodiment. FIG. 1 illustrates a rod-type light emitting diode having a substantially cylindrical shape, as an example of the light emitting element LD. However, the type and/or shape of the light emitting element LD that may be applied to the disclosure are not limited thereto.

Referring to FIG. 1, the light emitting element LD in accordance with the embodiment may include a first conductivity type semiconductor layer 11, a second conductivity type semiconductor layer 13, and an active layer 12 interposed between the first and second conductivity type semiconductor layers 11 and 13. For example, the light emitting element LD may be configured or formed of a stacked body formed by successively stacking the first conductivity type semiconductor layer 11, the active layer 12, and the second conductivity type semiconductor layer 13.

In an embodiment, the light emitting element LD may be provided in the form of a rod extending in one direction. In a case that the direction in which the light emitting element LD extends is defined as the longitudinal direction, the light emitting element LD may have a first end and a second end in the longitudinal direction.

In an embodiment, one of the first and second conductivity type semiconductor layers 11 and 13 may be disposed on the first end of the light emitting element LD, and the other of the first and second conductivity type semiconductor layers 11 and 13 may be disposed on the second end of the light emitting element LD.

In an embodiment, the light emitting element LD may be fabricated in the form of a rod. Herein, the term "rod-like shape" embraces a rod-like shape and a bar-like shape such as a substantially cylindrical shape and a prismatic shape extending in a longitudinal direction (for example, to have an aspect ratio greater than about 1), and the cross-sectional shape thereof is not limited to a particular shape. For example, a length of the light emitting element LD may be greater than a diameter thereof (or a width of the cross-section thereof).

In an embodiment, the light emitting element LD may have a small diameter and/or length such as a micro scale or a nano scale, for example. However, the size of the light emitting element LD is not limited to this. For instance, the light emitting element LD may be changed in various sizes depending on design conditions of the light emitting display device to which the light emitting element LD is applied.

The first conductivity type semiconductor layer 11 may include, for example, at least one n-type semiconductor layer. For instance, the first conductivity type semiconductor layer 11 may include an n-type semiconductor layer which may include any one semiconductor material of InAlGaN, GaN, AlGaN, InGaN, AlN, and InN, and is doped with a first conductive dopant such as Si, Ge, or Sn. However, the material forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multiple quantum well structure. In an embodiment, a cladding layer (not shown) doped with a conductive dopant may be formed or disposed on and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

In a case that an electric field of a predetermined voltage or more is applied to the opposite ends of the light emitting element LD, the light emitting element LD emits light by coupling of electron-hole pairs in the active layer 12. Since light emission of the light emitting element LD may be controlled based on the foregoing principle, the light emitting element LD may be used as a light source of a pixel.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which may include at least one semiconductor material of InAlGaN, GaN, AlGaN, InGaN, AlN, and InN, and is doped with a second conductive dopant such as Mg. However, the material forming the second conductivity type semiconductor layer 13 is not limited to this, and the second conductivity type semiconductor layer 13 may be formed of various other materials.

In an embodiment, the light emitting element LD may include additional other components as well as the above-described first conductivity type semiconductor layer 11, active layer 12, and second conductivity type semiconductor layer 13. For example, the light emitting element LD may include at least one fluorescent layer, at least one active layer, at least one semiconductor layer and/or at least one electrode layer disposed on and/or under or below the first conductivity type semiconductor layer 11, the active layer 12, and/or the second conductivity type semiconductor layer 13.

In an embodiment, the light emitting element LD may include an insulating film 14. In an embodiment, the insulating film 14 may be formed or disposed to enclose an outer circumferential surface of at least the active layer 12. The insulating film 14 may enclose at least portions of the first and second conductivity type semiconductor layers 11 and 13.

Although FIG. 1 illustrates the insulating film 14 with a portion thereof being eliminated so as to clearly show the stacked structure of the light emitting element LD, the insulating film 14, the insulating film 14 may entirely enclose an outer circumferential surface (for example, cylindrical side surface) except for both ends of the light emitting element LD. Alternatively, in an embodiment, the insulating film 14 may cover or overlap only a portion of a side surface of the first conductivity type semiconductor layer 11, the active layer 12, and/or the second conductivity type semiconductor layer 13. Alternatively, in an embodiment, the insulating film 14 may be omitted.

In an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, the insulating film 14 may be formed of various insulating materials.

In a case that the insulating film 14 is provided or disposed on the light emitting element LD, the active layer 12 of the light emitting element LD may be prevented from short-circuiting with a first and/or second electrode (not shown), by way of example. Consequently, the electrical stability of the light emitting element LD may be secured.

Because of the insulating film 14 formed or disposed on the surface of the light emitting element LD, occurrence of a defect on the surface of the light emitting element LD may be minimized, whereby the lifetime and efficiency of the light emitting element LD may be improved. In a case that the insulating film 14 is formed or disposed on each light emitting element LD, even in a case that light emitting elements LD may be disposed adjacent to each other, the light emitting elements LD may be prevented from undesirably short-circuiting.

In an embodiment, the light emitting element LD may be fabricated through a surface treatment process. For example, the light emitting element LD may be surface-treated (for example, through a coating process) so that, in a case that light emitting elements LD are mixed with a fluidic solution and then supplied to each light emitting area (for example, a light emitting area of each pixel), the light emitting elements LD may be evenly distributed rather than unevenly aggregating in the solution.

The above-described light emitting element LD may be used as a light source in different types of display devices including a light emitting display panel. For example, at least one light emitting element LD may be disposed in each pixel area of the light emitting display panel, thereby forming an emission unit of each pixel. The field of application of the light emitting element LD according to the disclosure is not limited to the display device. For example, the light emitting element LD may also be used in other types of light emitting devices such as a lighting device, which requires a light source.

Figure 3A:
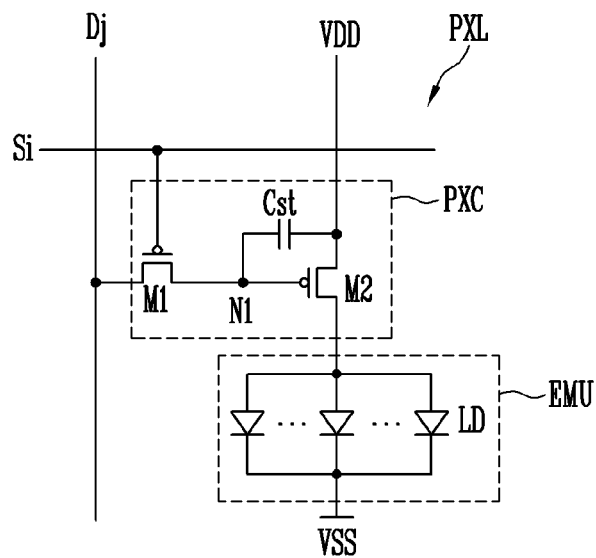
FIGS. 3A and 3B are equivalent circuit diagrams illustrating an embodiment of a pixel that may be provided or disposed on the light emitting display panel of FIG. 2.
Figure 3B:
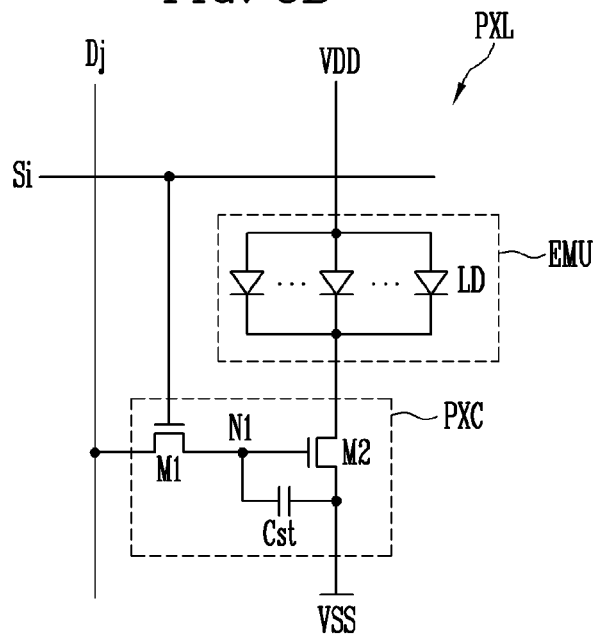

FIG. 2 is a diagram illustrating a light emitting display panel 110 in accordance with an embodiment. FIGS. 3A and 3B are diagrams illustrating an embodiment of a pixel PXL that may be provided or disposed on the light emitting display panel 110 of FIG. 2. FIGS. 2 to 3B simply illustrate the structure of the light emitting display panel 110 in accordance with the embodiment, focusing on a display area DA. However, according to an embodiment, at least one driving circuit, for example, a scan driver and/or a data driver may be disposed on the light emitting display panel 110.

Referring to FIG. 2, the light emitting display panel 110 may include a substrate 111, and pixels PXL disposed on the substrate 111. In detail, the light emitting display panel 110 may include a display area DA that may display an image, and a non-display area NDA formed or disposed in a predetermined area other than the display area DA. The pixels PXL may be disposed in the display area DA on the substrate 111.

In an embodiment, the display area DA may be disposed in a central portion of the light emitting display panel 110, and the non-display area NDA may be disposed in a perimeter portion of the light emitting display panel 110 to enclose the display area DA. The locations of the display area DA and the non-display area NDA are not limited to this, and the locations thereof may be changed.

The substrate 111 may be a rigid or flexible substrate, and the material or properties thereof are not particularly limited. For example, the substrate 111 may be a rigid substrate made of glass or reinforced glass, or a flexible substrate formed of a thin film made of plastic or metal.

An area on the substrate 111 may be defined as the display area DA in which the pixels PXL may be disposed, and the other area thereof may be defined as the non-display area NDA. Various lines and/or internal circuit units which may be electrically coupled or electrically connected to the pixels PXL of the display area DA may be disposed in the non-display area NDA.

Each of the pixels PXL may include at least one light emitting element LD (for example, at least one light emitting element LD shown in FIG. 1) which may be driven by a corresponding scan signal and a corresponding data signal. For example, each pixel PXL may include rod-type light emitting diodes, each of which has a small size corresponding to a micro scale or a nano scale. For instance, each pixel PXL may include rod-type light emitting diodes that may be electrically coupled or electrically connected in series and/or in parallel, and the rod-type light emitting diodes may form the light source of each pixel PXL.

In an embodiment, each pixel PXL may be formed of an active pixel illustrated in FIG. 3A or 3B. However, the type and/or structure of the pixels PXL are not particularly limited. For example, each pixel PXL may have substantially the same structure as that of a pixel of various passive or active light emitting display devices.

Referring to FIG. 3A, each pixel PXL may include an emission unit EMU that may generate light having a luminance corresponding to a data signal, and a pixel circuit PXC that may drive the emission unit EMU.

In an embodiment, the emission unit EMU may include light emitting elements LD coupled or connected to each other in series and/or in parallel between first and second pixel power supplies VDD and VSS. Here, the first and second pixel power supplies VDD and VSS may have different potentials to make it possible for the light emitting elements LD to emit light. For example, the first pixel power supply VDD may be set as a high-potential pixel power supply, and the second pixel power supply VSS may be set as a low-potential pixel power supply. In this case, a potential difference between the first and second pixel power supplies VDD and VSS may be equal to or greater than the threshold voltage of the light emitting elements LD.

Although in FIG. 3A there is illustrated an embodiment in which the light emitting elements LD forming the emission unit EMU of each pixel PXL may be electrically coupled or electrically connected parallel to each other in the same direction (for example, in a forward direction) between the first pixel power supply VDD and the second pixel power supply VSS, the disclosure is not limited to this. For example, in an embodiment, some or a predetermined number of the light emitting elements LD may be electrically coupled or electrically connected to each other in the forward direction between the first and second pixel power supplies VDD and VSS, and the other light emitting elements LD may be electrically coupled or electrically connected to each other in the reverse direction. Alternatively, in an embodiment, at least one pixel PXL may include only a single light emitting element LD.

In an embodiment, first ends of the light emitting elements LD forming each emission unit EMU may be electrically coupled or electrically connected in common to a corresponding pixel circuit PXC through a first electrode of the corresponding emission unit EMU and may be electrically coupled or electrically connected to the first pixel power supply VDD through the pixel circuit PXC. Second ends of the light emitting elements LD may be electrically coupled or electrically connected in common to the second pixel power supply VSS through a second electrode of the corresponding emission unit EMU. Hereinafter, the first electrode and the second electrode disposed in each emission unit EMU may be respectively referred to as "first pixel electrode" and "second pixel electrode".

Each emission unit EMU may emit light having luminance corresponding to driving current supplied thereto through the corresponding pixel circuit PXC. Thereby, a predetermined image may be displayed on the display area DA.

The pixel circuit PXC may be electrically coupled or electrically connected to a scan line Si and a data line Dj of the corresponding pixel PXL. For example, in a case that the pixel PXL is disposed on an i-th row and a j-th column of the display area DA, the pixel circuit PXC of the pixel PXL may be electrically coupled or electrically connected to an i-th scan line Si and a j-th data line Dj of the display area DA. In an embodiment, the pixel circuit PXC may include a first transistor M1, a second transistor M2, and a storage capacitor Cst.

A first electrode of the first transistor (switching transistor; M1) may be electrically coupled or electrically connected to the data line Dj, and a second electrode thereof may be electrically coupled or electrically connected to the first node N1. Here, the first electrode and the second electrode may be different electrodes. For example, in a case that the first electrode is a source electrode, the second electrode may be a drain electrode. A gate electrode of the first transistor M1 may be electrically coupled or electrically connected to the scan line Si.

In case that a scan signal of a gate-on voltage (for example, a low voltage) is supplied from the scan line Si, the first transistor M1 may be turned on to electrically couple or electrically connect the first node N1 to the data line Dj. Here, a data signal of a corresponding frame may be supplied to the data line Dj. The data signal may be transmitted to the first node N1 via the first transistor M1. Thereby, a voltage corresponding to the data signal may be charged to the storage capacitor Cst.

A first electrode of the second transistor (driving transistor; M2) may be electrically coupled or electrically connected to the first pixel power supply VDD, and a second electrode thereof may be may be electrically coupled or electrically connected to the emission unit EMU through the first pixel electrode (for example, the first electrode of the corresponding emission unit EMU). A gate electrode of the second transistor M2 may be electrically coupled or electrically connected to the first node N1. The second transistor M2 may control driving current to be supplied to each emission unit EMU in response to a voltage of the first node N1.

One or an electrode of the storage capacitor Cst may be electrically coupled or electrically connected to the first pixel power supply VDD, and the other electrode thereof may be electrically coupled or electrically connected to the first node N1. The storage capacitor Cst may charge voltage corresponding to a data signal supplied to the first node N1 during a corresponding frame period, and maintain the charged voltage until a data signal of a subsequent frame is supplied.

The structure of the pixel circuit PXC is not limited to the embodiment illustrated in FIG. 3A. For instance, the pixel circuit PXC may be formed of a pixel circuit which may have various structures and/or be operated by various driving schemes. For instance, the pixel circuit PXC may include at least one switching element, such as a switching element that may compensate for the threshold voltage of the second transistor M2, a switching element that may initialize the gate voltage of the second transistor M2, and/or a switching element that may control the emission time of the emission unit EMU. In an embodiment, each switching element may be composed of a transistor, but is not limited thereto. The pixel circuit PXC may include at least one capacitor including a boosting capacitor that may boost the gate voltage of the second transistor M2.

Although in FIG. 3A the transistors, for example, the first and second transistors M1 and M2, included in the pixel circuit PXC have been illustrated as being formed of P-type transistors, the disclosure is not limited to this. In other words, at least one of the first and second transistors M1 and M2 may be changed to an N-type transistor.

For example, as shown in FIG. 3B, both the first and second transistors M1 and M2 may be formed of N-type transistors. The configuration and operation of the pixel PXL illustrated in FIG. 3B, other than the fact that connection positions of some or a predetermined number of circuit elements have been changed depending on a change in type of the transistors, are substantially similar to those of the pixel PXL of FIG. 3A. Therefore, detailed description of the pixel PXL of FIG. 3B will be omitted.

Figure 4:
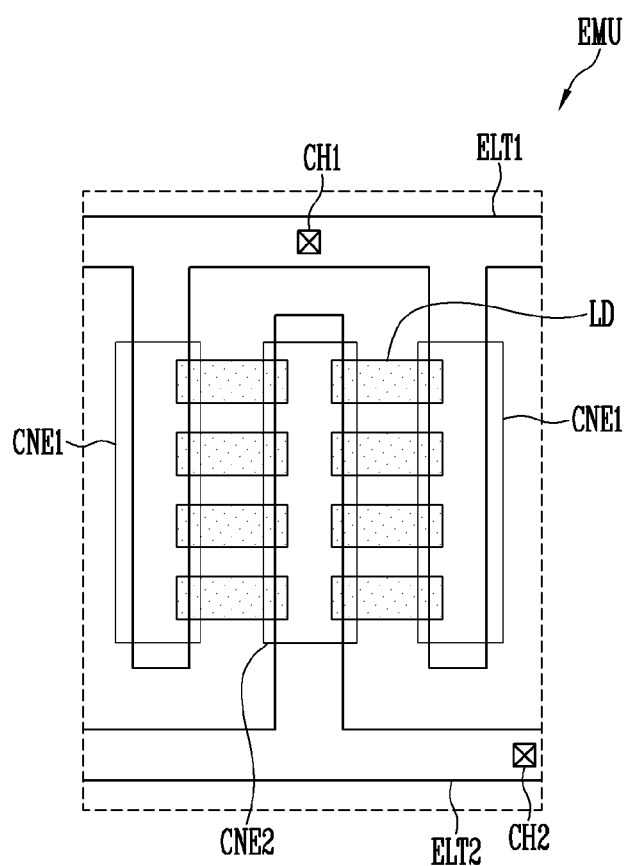
FIG. 4 is a diagram illustrating an emission unit of a pixel in accordance with an embodiment.

FIG. 4 is a diagram illustrating an emission unit EMU of a pixel in accordance with an embodiment. For convenience, the emission unit EMU of a relatively simple structure in which each electrode is composed of a single layer is illustrated in FIG. 4. However, the disclosure is not limited thereto. For example, at least one of electrodes illustrated in FIG. 4 may be formed of a multi-layered structure. Of course, at least one conductive layer and/or insulating layer (not shown) may be disposed in the emission unit EMU.

Meanwhile, the emission unit EMU of FIG. 4 may form the light source of the pixel PXL illustrated in FIGS. 2, 3A and 3B as well as light sources of various light emitting devices. For convenience, the emission unit EMU in accordance with an embodiment will be described below with reference to FIGS. 3A, 3B, and 4.

Referring to FIGS. 3A to 4, each emission unit EMU may include first and second pixel electrodes ELT1 and ELT2, and light emitting elements LD electrically coupled or electrically connected between the first and second pixel electrodes ELT1 and ELT2. However, the disclosure is not limited to the embodiment illustrated in FIGS. 3A to 4. For example, the emission unit EMU may be provided with only a single light emitting element LD. In an embodiment, each emission unit EMU may be disposed in a pixel area that may form each pixel PXL, and may be enclosed by a dam or bank structure (not shown).

In an embodiment, the first pixel electrode ELT1 may be electrically coupled or electrically connected to the pixel circuit of the corresponding pixel, for example, the pixel circuit PXC illustrated in FIG. 3A or the like, while the second pixel electrode ELT2 may be electrically coupled or electrically connected to the second pixel power supply VSS. For instance, the first pixel electrode ELT1 may be electrically coupled or electrically connected through a first contact hole CH1 to the second transistor M2 of FIG. 3A, and the second pixel electrode ELT2 may be electrically coupled or electrically connected through a second contact hole CH2 to the second pixel power supply VSS.

However, the disclosure is not limited thereto. For example, in an embodiment, the first pixel electrode ELT1 may be electrically coupled or electrically connected through the first contact hole CH1 to the first pixel power supply VDD, and the second pixel electrode ELT2 may be electrically coupled or electrically connected through the second contact hole CH2 to the second transistor M2 of FIG. 3B. Alternatively, in an embodiment, the first and/or the second pixel electrode ELT1 and ELT2 may be directly electrically coupled or electrically connected to the first and/or second pixel power supply VDD and VSS without passing through the first contact hole CH1, the second contact hole CH2 and/or the pixel circuit PXC.

At least one area of the first pixel electrode ELT1 may be disposed to be opposite to at least one area of the second pixel electrode ELT2, and light emitting elements LD may be electrically coupled or electrically connected between the first and second pixel electrodes ELT1 and ELT2. In the disclosure, a direction in which the light emitting elements LD may be arranged or disposed is not particularly limited. The light emitting elements LD may be electrically coupled or electrically connected in series and/or in parallel between the first and second pixel electrodes ELT1 and ELT2.

In an embodiment, each of the light emitting elements LD may be formed of a light emitting diode which is made of material having an inorganic crystal structure and has a subminiature size, for example, corresponding to a nano scale or a micro scale. For example, each light emitting element LD may be a light emitting element LD of FIG. 1. In an embodiment, the light emitting elements LD may be prepared in a form dispersed in a predetermined solution (hereinafter referred to as "LED solution"), and may be supplied to each emission unit EMU using an inkjet method or the like within the spirit and the scope of the disclosure. For example, the light emitting elements LD may be mixed with a volatile solvent and supplied to each emission unit EMU. Here, in a case that a predetermined voltage (or "alignment voltage") is applied to the first and second pixel electrodes ELT1 and ELT2, an electric field is formed between the first and second pixel electrodes ELT1 and ELT2, whereby the light emitting elements LD are self-aligned between the first and second pixel electrodes ELT1 and ELT2. After the light emitting elements LD have been aligned, the solvent may be removed by a volatilization scheme or other schemes. In this way, the light emitting elements LD may be reliably arranged or disposed between the first and second pixel electrodes ELT1 and ELT2. In other words, the light emitting elements LD may be coupled physically and/or electrically between the first and second pixel electrodes ELT1 and ELT2.

In an embodiment, at least one contact electrode may be electrically coupled or electrically connected to both ends of the light emitting elements LD, respectively. For example, each emission unit EMU may include a first contact electrode CNE1 that may stably electrically couple or electrically connect the first end of each light emitting element LD to the first pixel electrode ELT1, and a second contact electrode CNE2 that may stably electrically couple or electrically connect the second end of each light emitting element LD to the second pixel electrode ELT2.

Each of the first and second contact electrodes CNE1 and CNE2 may come into contact with and/or be electrically coupled or electrically connected to any one of the first and second pixel electrodes ELT1 and ELT2 and the first end of at least one of the light emitting elements LD. For example, the first and second contact electrodes CNE1 and CNE2 may cover or overlap both ends of the light emitting elements LD and at least one or an area of the first and second pixel electrodes ELT1 and ELT2.

The light emitting elements LD disposed on the emission unit EMU may be collected to form the light source of the corresponding pixel PXL. For example, in a case that driving current flows through the emission unit EMU of at least one pixel PXL during each frame period, the light emitting elements LD that may be electrically coupled or electrically connected in the forward direction between the first and second pixel electrodes ELT1 and ELT2 of the pixel PXL may emit light having a luminance corresponding to the driving current.

Figure 5:
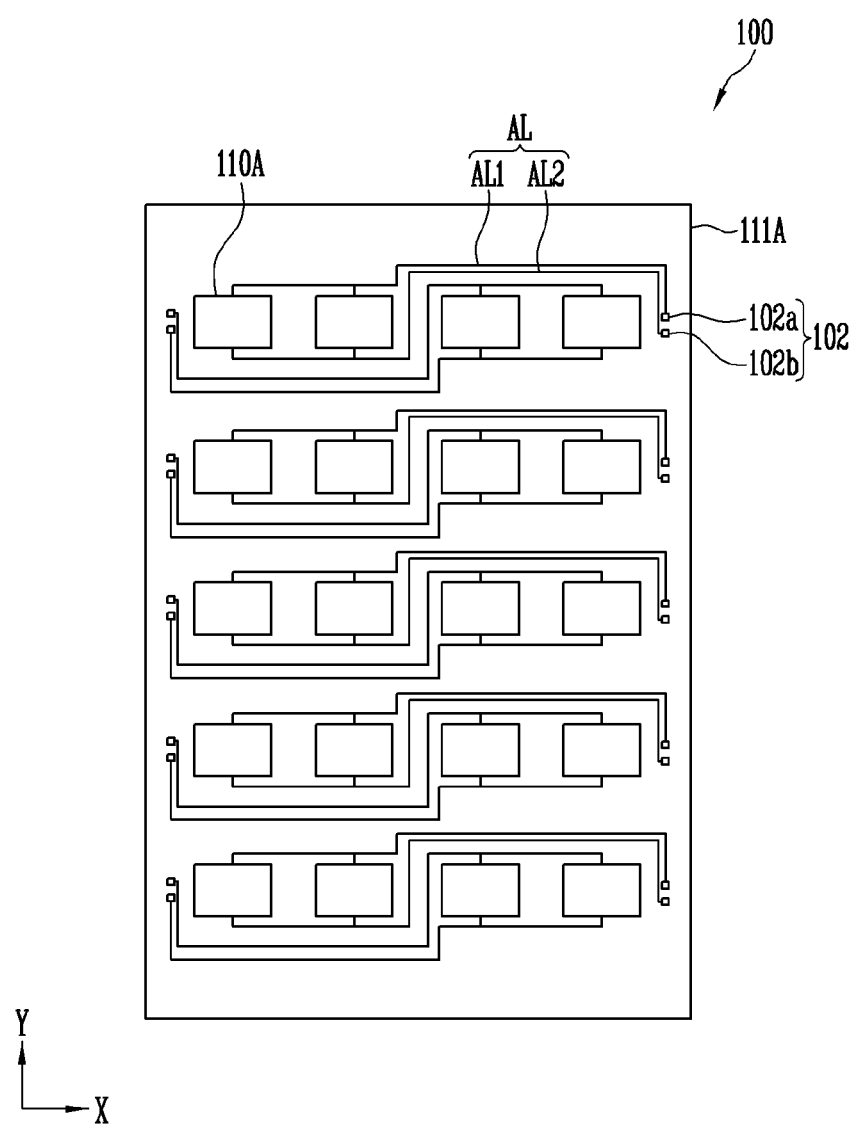
FIG. 5 is a diagram illustrating a base substrate for manufacturing a light emitting display panel in accordance with an embodiment.

FIG. 5 is a diagram illustrating a base substrate 100 for manufacturing a light emitting display panel 110 in accordance with an embodiment. The base substrate 100 may be used to simultaneously manufacture light emitting display panels 110 on one mother substrate 111A. For example, after the light emitting display panels 110 is simultaneously made on the large-sized mother substrate 111A in the form of the base substrate 100, it may be divided into individual light emitting display panels 110 through a scribing process or the like within the spirit and the scope of the disclosure.

Referring to FIG. 5, the base substrate 100 may include cells 110A arranged or disposed in the first direction and/or the second direction (for example, X-axis and/or Y-axis direction) on the mother substrate 111A. Each cell 110A may be used to manufacture an individual light emitting display panel 110, for example, the light emitting display panel 110 illustrated in FIG. 2. For example, each cell 110A may include pixels PXL disposed in a predetermined display area DA. Each pixel PXL may include, for example, the emission unit EMU having the light emitting elements LD as illustrated in FIG. 4 and the like within the spirit and the scope of the disclosure. For convenience, the internal configuration of the individual cell 110A is omitted in FIG. 5.

Conductive pads 102 may be disposed in an area of the base substrate 100, for example, a perimeter of at least one side of the base substrate 100. In an embodiment, the conductive pads 102 may include at least one pair of pads composed of first and second pads 102a and 102b that are supplied with different voltages. For instance, multiple pairs of first and second pads 102a and 102b may be disposed on perimeters of both sides of the base substrate 100 that face each other. In an embodiment, each pair of first and second pads 102a and 102b may be electrically coupled or electrically connected to at least one cell 110A.

The base substrate 100 may include alignment lines AL to electrically couple or electrically connect the cells 110A to the conductive pads 102. In an embodiment, the alignment lines AL may include at least one pair of first and second alignment lines AL1 and AL2 to couple or connect at least one of the cells 110A formed or disposed on the base substrate 100 to any one pair of first and second pads 102a and 102b. For instance, multiple pairs of first and second alignment lines AL1 and AL2 corresponding to the multiple pairs of first and second pads 102a and 102b may be disposed on the base substrate 100.

Each first alignment line AL1 may be electrically connected to one electrode formed or disposed in at least one cell 110A, and each second alignment line AL2 may be electrically connected to another electrode formed or disposed in at least one cell 110A. For instance, each first alignment line AL1 may be electrically connected in common to first pixel electrodes ELT1 of pixels PXL formed or disposed in at least one cell 110A, and each second alignment line AL2 may be electrically connected in common to second pixel electrodes ELT2 of the pixels PXL formed or disposed in at least one cell 110A. Thus, voltage applied to the first pads 102a may be transmitted through the first alignment lines AL1 to the first pixel electrodes ELT1 in each cell 110A, and voltage applied to the second pads 102b may be transmitted through the second alignment lines AL2 to the second pixel electrodes ELT2 in each cell 110A.

In an embodiment, among the cells 110A formed or disposed on the base substrate 100, at least one cell 110A disposed on any one side of the base substrate 100, for example, a left side may be electrically connected to a pair of the first and second pads 102a and 102b disposed on the other side of the base substrate 100, for example, a right side. Among the cells 110A, at least one cell 110A disposed on the other side of the base substrate 100, for example, the right side may be electrically connected to a pair of the first and second pads 102a and 102b disposed on an opposite side of the base substrate 100, for example, the left side.

For example, the light emitting elements LD may be supplied to at least one cell 110A disposed on any one side of the base substrate 100, and simultaneously voltage may be applied to at least one cell 110A through the pair of the first and second pads 102a and 102b disposed on the other side of the base substrate 100. Thus, the light emitting elements LD may be supplied to at least one cell 110A, and simultaneously an electric field may be applied to the cell to align the light emitting elements LD.

Figure 6:
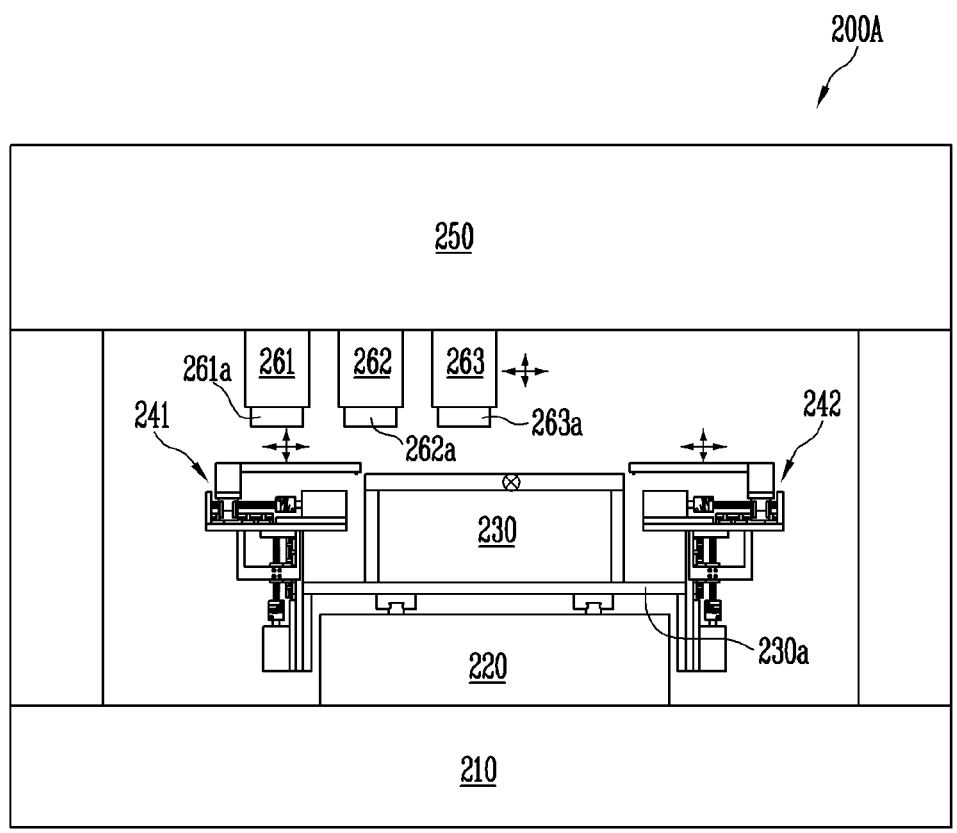
FIG. 6 is a diagram illustrating an apparatus for manufacturing a light emitting display device in accordance with an embodiment.

FIG. 6 is a diagram illustrating an apparatus 200A for manufacturing a light emitting display device in accordance with an embodiment. By way of non-limiting example, FIG. 6 illustrates an embodiment of the manufacturing apparatus 200A that may supply the light emitting elements LD to the mother substrate 111A for manufacturing the panel of the light emitting display device, i.e. the light emitting display panel 110, and simultaneously may apply the electric field to the light emitting elements LD. For instance, the manufacturing apparatus 200A may supply the light emitting elements LD to an interior (for example, the light emitting area of each of the pixels PXL) of each cell 110A disposed on the mother substrate 111A shown in FIG. 5 and simultaneously to apply the electric field for inducing the self-alignment of the light emitting elements LD. In an embodiment, the manufacturing apparatus 200A may be an inkjet printer that supplies (for example, drops) the light emitting elements LD onto the mother substrate 111A by an inkjet method.

Referring to FIG. 6, the apparatus 200A for manufacturing the light emitting display device according to an embodiment may include a main plate 210 and an auxiliary plate 220 disposed sequentially from a bottom, a stage 230 disposed on the auxiliary plate 220, at least one electric-field application module 240 disposed on at least one side of the stage 230, a gantry 250 disposed on the stage 230, and at least one printing head 260 supported by the gantry 250 and disposed on the stage 230. In FIG. 6, reference numeral "240" may comprehensively denote at least one electric-field application module, and denote, for example, each electric-field application module or electric-field application modules. Reference numeral "260" may comprehensively denote at least one printing head, and denote, for example, each printing head or printing heads.

In an embodiment, the electric-field application module 240 and/or the printing head 260 may perform both the horizontal movement and the vertical movement. For instance, the electric-field application module 240 and/or the printing head 260 may perform both the horizontal movement in the X-axis direction and the vertical movement (for example, up-and-down movement) in the Z-axis direction. In an embodiment, the stage 230 may be movable in at least one direction. For instance, the stage 230 may be designed to perform the horizontal movement in the Y-axis direction.

According to the above-described embodiment, the operation of the stage 230, the electric-field application module 240 and/or the printing head 260 may be more easily controlled. Thus, the process of disposing the base substrate 100 on the stage 230 to supply the light emitting elements LD is performed. Simultaneously, the electric field may be smoothly applied to the cell 110A to which the light emitting elements LD are supplied.

In an embodiment, the electric-field application module 240 may be disposed to be adjacent to each of at least two perimeter areas of the stage 230. For example, the electric-field application module 240 may include a first electric-field application module 241 disposed on a first side of the stage 230, and a second electric-field application module 242 disposed on a second side of the stage 230.

In an embodiment, the first and second sides of the stage 230 may be opposite ends that face each other. For instance, the first side and the second side may be the left side and the right side of the stage 230, respectively. In other words, the first and second electric-field application modules 241 and 242 may be disposed to be adjacent to both sides of the stage 230 facing each other, respectively.

In an embodiment, the first and second electric-field application modules 241 and 242 may be connected to and/or installed at a structure provided or disposed on a lower end of the stage 230. For instance, the first and second electric-field application modules 241 and 242 may be coupled or connected to a support plate 230a provided or disposed on the lower end of the stage 230. However, in the disclosure, the position and/or installation structure of the first and second electric-field application modules 241 and 242 are not limited particularly, and may be variously changed.

In an embodiment, the first and second electric-field application modules 241 and 242 may be driven independently of each other, or driven in conjunction with each other. For instance, the first and second electric-field application modules 241 and 242 may be driven simultaneously, sequentially or alternately.

Thus, in a case that the apparatus 200A for manufacturing the light emitting display device is provided with the first and second electric-field application modules 241 and 242 disposed on different sides of the stage 230, the electric field may be smoothly applied to the base substrate 100 seated on the stage 230 while avoiding a collision between the electric-field application module 240 and the printing head 260. For instance, by optionally driving at least one of the first and second electric-field application modules 241 and 242 depending on the position of the printing head 260, a desired electric field may be applied to each cell 110A on the base substrate 100 while preventing mutual interference and/or collision between the electric-field application module 240 and the printing head 260.

In an embodiment, the printing head 260 may include printing heads, for example, first, second, and third printing heads 261, 262, and 263 to spray different types of solutions, for example, solutions in which the light emitting elements LD of predetermined colors are dispersed onto the stage 230. For example, the first, second, and third printing heads 261, 262, and 263 may drop solution in which red, green, and blue light emitting elements LD are dispersed in the form of a droplet to a top (for example, an interior of each cell 110A of the base substrate 100 seated on the stage 230) of the stage 230. To this end, the first, second, and third printing heads 261, 262, and 263 may be provided with injection nozzles 261a, 262a, and 263a, respectively, and may supply red, green and blue light emitting elements LD to each cell 110A by the inkjet method. For instance, the first, second, and third printing heads 261, 262, and 263 may be inkjet heads (or injection heads).

As described above, the manufacturing apparatus 200A according to an embodiment may be provided with both the electric-field application module 240 and the printing head 260. Thus, the light emitting elements LD may be supplied to the substrate of the light emitting display device placed on the stage 230, for example, the base substrate 100, and simultaneously a predetermined electric field may be applied to the light emitting elements LD to induce the self-alignment of the light emitting elements LD. Thus, the light emitting display panel 110 using the light emitting elements LD as the light source may be easily manufactured.

Meanwhile, the remaining components constituting the manufacturing apparatus 200A, for example, the main plate 210, the auxiliary plate 220, and the gantry 250 may have various shapes and/or structures within the spirit and the scope of the disclosure. Therefore, detailed descriptions pertaining to this will be omitted.

Figure 7:
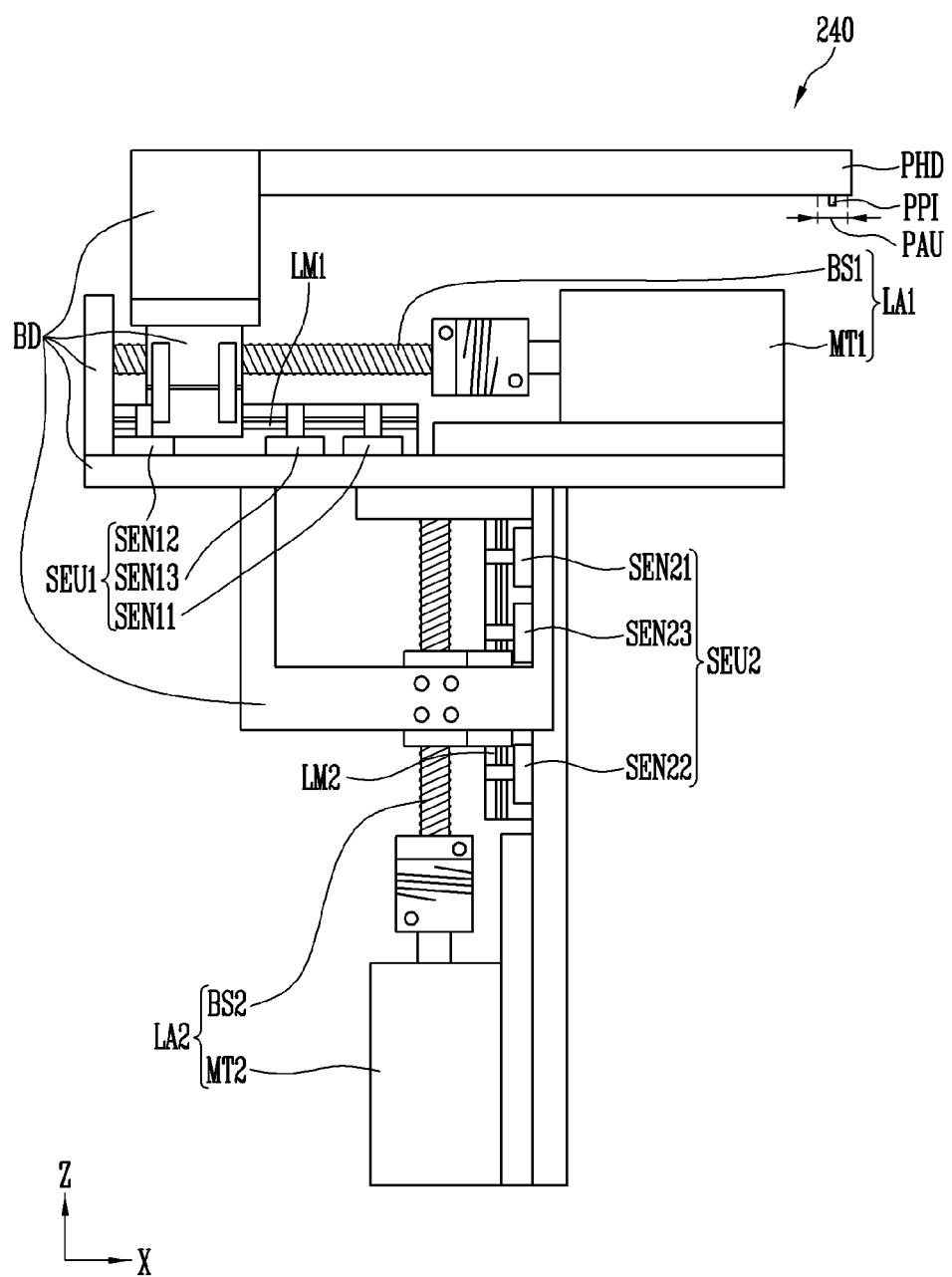
FIG. 7 is a diagram illustrating an embodiment of a configuration of an electric-field application module of FIG. 6.

FIG. 7 is a diagram illustrating an embodiment of a configuration of the electric-field application module 240 of FIG. 6. In an embodiment, the electric-field application module 240 illustrated in FIG. 7 may correspond to both the first and second electric-field application modules 241 and 242 of FIG. 6. For example, the first and second electric-field application modules 241 and 242 may have the substantially same configuration, and may be disposed to face each other.

Referring to FIG. 7, each electric-field application module 240 may include a probe head PHD, first and second drivers LA1 and LA2 coupled or connected to the probe head PHD to move the probe head PHD in a predetermined direction, and a body BD coupled or connected to the probe head PHD and the first and second drivers LA1 and LA2.

In an embodiment, each electric-field application module 240 may include at least one linear motion guide LM1, LM2 coupled or connected to the body BD to assist the stable movement of the electric-field application module 240, and at least one sensor unit SEU1, SEU2 for sensing the moving position of the probe head PHD in real time. For instance, each electric-field application module 240 may include the first linear motion guide LM1 and the first sensor unit SEU1 disposed around the first driver LA1, and the second linear motion guide LM2 and the second sensor unit SEU2 disposed around the second driver LA2.

The probe head PHD is provided with at least one probe pin (or also referred to as an "electrode pad", PPI) disposed on a surface thereof. For instance, the probe head PHD may include probe pins PPI that may be arranged or disposed in a pad component PAU located or disposed in a perimeter of a lower surface of the probe head. In an embodiment, each probe pin PPI may be electrically coupled or electrically connected to a power supply (not illustrated) to be supplied with a predetermined power or voltage from the power supply.

In an embodiment, the probe head PHD may be implemented as a probe bar having a substantially bar shape, but is not limited thereto. For example, the shape, structure and/or material of the probe head PHD may be variously changed.

The first driver LA1 may be coupled or connected to the probe head PHD through the body BD to move the probe head PHD in the horizontal direction. For instance, the first driver LA1 may be a linear actuator that moves the probe head PHD forwards and backwards or leftwards and rightwards in the X-axis direction.

In an embodiment, the first driver LA1 may include a first motor MT1, and a first ball screw BS1 coupled and/or connected to the first motor MT1 in the horizontal direction. Thereby, the first driver LA1 may adjust the horizontal position of the probe head PHD so that the probe head PHD may reach a desired position.

In an embodiment, the first motor MT1 may be a servomotor, but is not limited thereto. For example, the first motor MT1 may be configured or formed with various types of power sources as well as the servomotor. In an embodiment, the first motor MT1 may include a motor guide or the like within the spirit and the scope of the disclosure.

In an embodiment, the first ball screw BS1 may be a rolled ball screw, but is not limited thereto. For example, the first ball screw BS1 may be configured or formed with various mechanical devices (for example, various components converting rotary motion into linear motion) that may linearly move the probe head PHD using power generated by the first motor MT1, in addition to the rolled ball screw.

The second driver LA2 may be coupled or connected to the probe head PHD through the body BD to move the probe head PHD in the vertical direction. For instance, the second driver LA2 may be a linear actuator that moves the probe head PHD up and down in the Z-axis direction.

In an embodiment, the second driver LA2 may include a second motor MT2, and a second ball screw BS2 coupled and/or connected to the second motor MT2 in the vertical direction. Thereby, the second driver LA2 may adjust the height of the probe head PHD so that the probe head PHD may reach a desired position.

In an embodiment, the second motor MT2 may be a servomotor but is not limited thereto, and may be configured or formed with various types of power sources. In an embodiment, the second motor MT2 may include a motor guide or the like within the spirit and the scope of the disclosure.

In an embodiment, the second ball screw BS2 may be a rolled ball screw but is not limited thereto, and may be configured or formed with various mechanical devices that may linearly move the probe head PHD using power generated by the second motor MT2.

The first linear motion guide LM1 may be disposed around the first driver LA1 to assist the horizontal movement of the probe head PHD. The second linear motion guide LM2 may be disposed around the second driver LA2 to assist the vertical movement of the probe head PHD.

The first sensor unit SEU1 may be disposed around the first driver LA1 to sense the horizontal position of the probe head PHD. The first sensor unit SEU1 may determine whether the corresponding electric-field application module 240, for example the probe head PHD reaches a desired horizontal position.

In an embodiment, the first sensor unit SEU1 may include at least one of a first position sensor SEN11 that may sense the front limit of the probe head PHD, a second position sensor SEN12 that may sense the rear limit of the probe head PHD, and a third position sensor SEN13 located or disposed between the first and second position sensors SEN11 and SEN12 that may sense that the probe head PHD reaches a predetermined target point (for example, a horizontal position that may make contact with the conductive pads 102 of the base substrate 100). In a case that the first and second position sensors SEN11 and SEN12 may sense the front and rear limits, the excessive movement of the probe head PHD may be prevented. Thus, mechanical damage to the electric-field application module 240 may be prevented. In a case that the third position sensor SEN13 senses that the probe head PHD reaches the target point, the ease and reliability of a process may be secured.

The second sensor unit SEU2 may be disposed around the second driver LA2 to sense the vertical position (i.e. height) of the probe head PHD. The second sensor unit SEU2 may determine whether the corresponding electric-field application module 240, for example the probe head PHD reaches a desired vertical position.

In an embodiment, the second sensor unit SEU2 may include at least one of a first position sensor SEN21 that may sense the rise limit of the probe head PHD, a second position sensor SEN22 that may sense the drop limit of the probe head PHD, and a third position sensor SEN23 located or disposed between the first and second position sensors SEN21 and SEN22 that may sense that the probe head PHD reaches a predetermined target height (for example, a predetermined height for making contact with the conductive pads 102 of the base substrate 100). In a case that the first and second position sensors SEN21 and SEN22 may sense the lift limit, the excessive movement of the probe head PHD may be prevented. Thus, mechanical damage to the electric-field application module 240 may be prevented. In a case that the third position sensor SEN23 senses that the probe head PHD reaches the target height, the ease and reliability of a process may be secured.

Figure 8A:
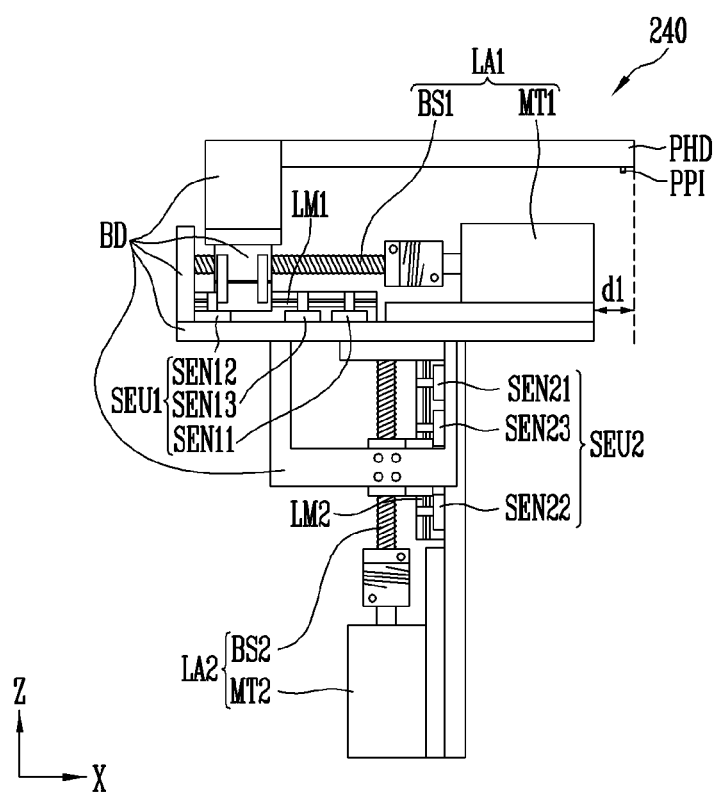
FIGS. 8A to 8C are diagrams illustrating an embodiment of a horizontal moving method of the electric-field application module of FIG. 7.
Figure 8B:
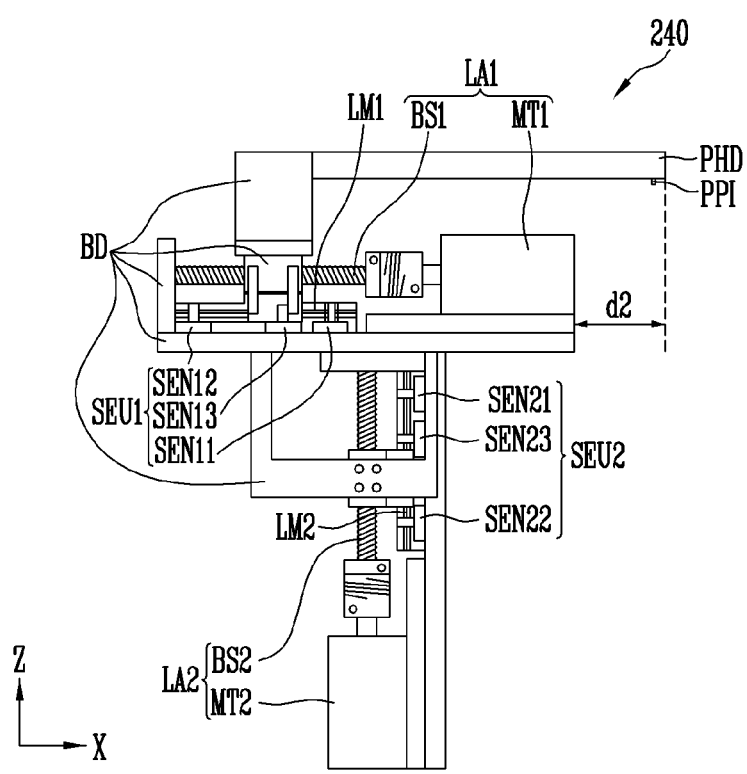
Figure 8C:
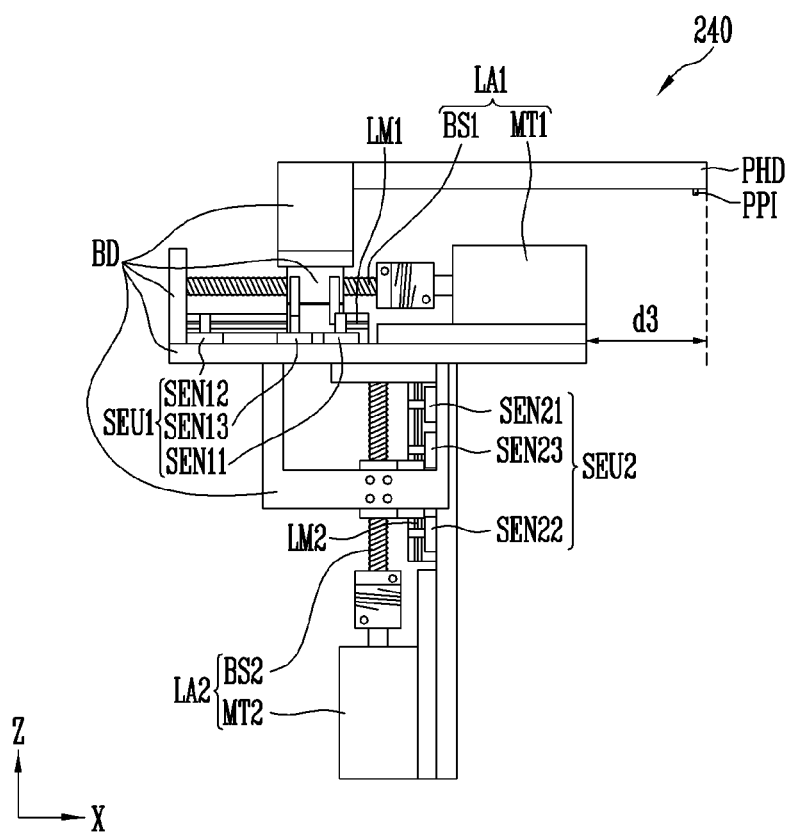

FIGS. 8A to 8C are diagrams illustrating an embodiment of a horizontal moving method of the electric-field application module 240 of FIG. 7.

Referring to FIGS. 8A to 8C, the electric-field application module 240 may be moved by the first driver LA1 in the horizontal direction. For instance, the probe head PHD may be moved forwards along the X-axis by the first driver LA1. In this case, a front end of the probe head PHD may move forwards to sequentially pass through positions spaced apart by a first distance d1, a second distance d2, and a third distance d3 that become gradually distant from an end of the first driver LA1 in the horizontal direction. On the contrary, in a case that the probe head PHD is moved backwards by the first driver LA1, the front end of the probe head PHD may move backwards to sequentially pass through positions that are horizontally spaced from the end of the first driver LA1 by the third distance d3, the second distance d2, and the first distance d1.

Figure 9A:
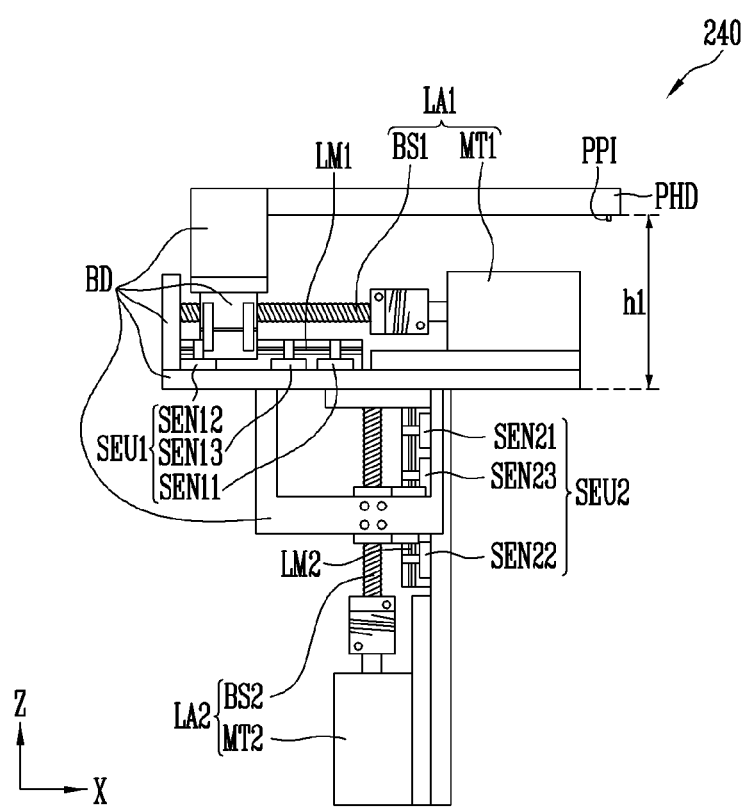
FIGS. 9A to 9C are diagrams illustrating an embodiment of a vertical moving method of the electric-field application module of FIG. 7.
Figure 9B:
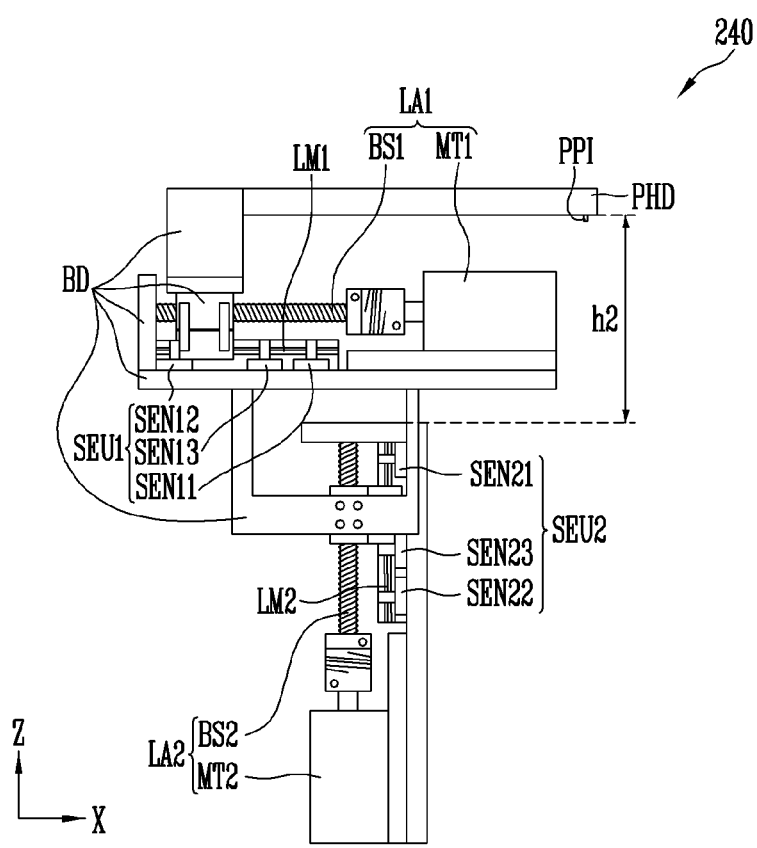
Figure 9C:
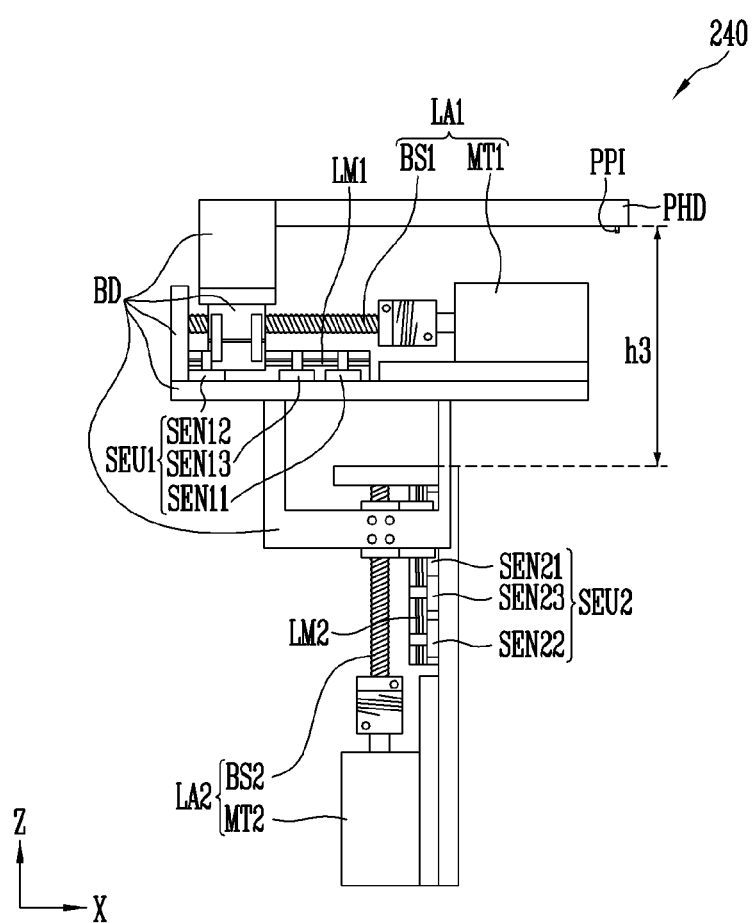

FIGS. 9A to 9C are diagrams illustrating an embodiment of a vertical moving method of the electric-field application module 240 of FIG. 7.

Referring to FIGS. 9A to 9C, the electric-field application module 240 may be moved by the second driver LA2 in the vertical direction. For instance, the probe head PHD may be moved upwards along the Z-axis by the second driver LA2. In this case, a rear surface of the probe head PHD may move upwards to sequentially pass through positions corresponding to a first height h1, a second height h2, and a third height h3 that gradually become higher from an end of the second driver LA2 in the vertical direction. On the contrary, in a case that the probe head PHD is moved downwards by the second driver LA2, the rear surface of the probe head PHD may move downwards to sequentially pass through positions that are vertically spaced from the end of the second driver LA2 by the third height h3, the second height h2, and the first height h1.

Figure 10:
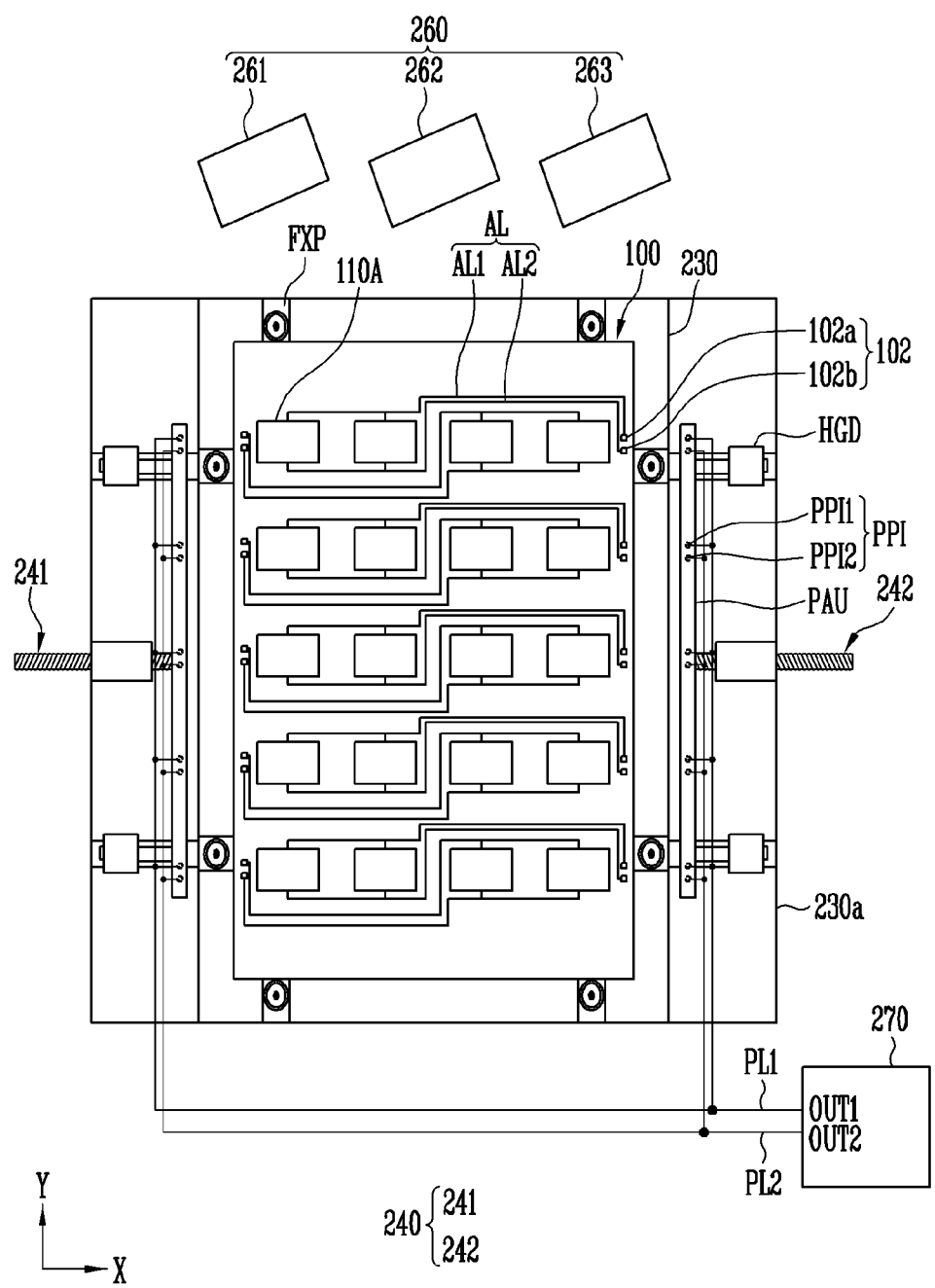
FIGS. 10 and 11A to 11D are diagrams illustrating an embodiment of a method of driving the manufacturing apparatus of FIG. 6.

FIGS. 10 and 11A to 11D are diagrams illustrating an embodiment of a method of driving the manufacturing apparatus 200A of FIG. 6. In detail, FIG. 10 is a plan view schematically illustrating a state in which the base substrate 100 of FIG. 5, for example, is disposed on the stage 230 of the manufacturing apparatus 200A. FIG. 10 illustrates the pad component PAU disposed on a surface of the probe head PHD instead of entirely illustrating the probe head PHD, so as to show the alignment position of the probe pins PPI of the manufacturing apparatus 200A and the base substrate 100. In FIGS. 10 and 11A to 11D, the structure of the electric-field application module 240 is schematically illustrated.

Referring to FIG. 10, probe pins PPI may be arranged or disposed in the pad component PAU of the probe head PHD. The manufacturing apparatus 200A according to an embodiment may include a power supply 270 that may supply a predetermined voltage to the probe pins PPI, and power lines PL1 and PL2 coupled or connected between the probe pins PPI and the power supply 270.

For instance, the pad component PAU may be disposed on a surface of the probe head PHD, for example, a lower surface thereof. The pad component PAU may include at least one first probe pin PPI1 electrically coupled or electrically connected via the first power line PL1 to the power supply 270, and at least one second probe pin PPI2 electrically coupled or electrically connected via the second power line PL2 to the power supply 270. For instance, the pad component PAU may include first probe pins PPI1 that may be electrically coupled or electrically connected in common to the first power line PL1, and second probe pins PPI2 that may be disposed to be paired with the first probe pins PPI1, respectively, and may be electrically coupled or electrically connected in common to the second power line PL2.

In an embodiment, the first and second probe pins PPI1 and PPI2 may correspond to the conductive pads 102 formed or disposed on the base substrate 100. For instance, in a case that the first electric-field application module 241 is driven, the first and second probe pins PPI1 and PPI2 provided or disposed on the first electric-field application module 241 may come into contact with the conductive pads 102 disposed on the left side of the base substrate 100 to apply a predetermined voltage. In a case that the second electric-field application module 242 is driven, the first and second probe pins PPI1 and PPI2 provided or disposed on the second electric-field application module 242 may come into contact with the conductive pads 102 disposed on the right side of the base substrate 100 to apply a predetermined voltage.

In an embodiment, the power supply 270 may supply a predetermined voltage (or signal) having a predetermined waveform and/or potential through a first output terminal OUT1 to the first power line PL1, and may supply a reference voltage having a predetermined reference potential through a second output terminal OUT2 to the second power line PL2. For instance, the power supply 270 may supply an alternating current (AC) voltage having a sine waveform to the first power line PL1, and supply a ground voltage to the second power line PL2.

Meanwhile, in an embodiment, the manufacturing apparatus 200A may include at least one additional component. For instance, the manufacturing apparatus 200A may include at least one horizontal guide HGD disposed in or around the first and/or second electric-field application module 241, 242, and at least one fixing component FXP provided or disposed on the stage 230.

In an embodiment, after that the base substrate 100 is seated on the stage 230, in a case that a process for disposing the light emitting elements LD on the base substrate 100 is started, the first and second electric-field application modules 241 and 242 are driven to supply a predetermined voltage to at least some or a predetermined number of the conductive pads 102 of the base substrate 100. Thus, the electric field may be formed between the first and second pixel electrodes ELT1 and ELT2 formed or disposed on at least one cell 100A located or disposed in the base substrate 100, by way of example, each pixel area of at least one cell 110A. In a case that the process is started, at least one printing head 260 moves to the top of the base substrate 100 to supply the light emitting elements LD to the at least one cell 110A. Thus, the light emitting elements LD may be supplied to at least one cell 110A, and simultaneously the light emitting elements LD may be aligned between the first and second pixel electrodes ELT1 and ELT2.

In an embodiment, the first and second electric-field application modules 241 and 242 may be driven sequentially or alternately. For instance, the first and second electric-field application modules 241 and 242 may be sequentially driven in response to the position and/or moving direction of the printing head 260 that may be operated. For instance, the first and second electric-field application modules 241 and 242 may be operated sequentially or alternately to avoid collision with the printing head 260.

For example, as illustrated in FIGS. 11A to 11D, at least one printing head 260 may spray the droplet DRL onto the stage 230 while moving from the right side to the left side of the stage 230 above the stage 230. In an embodiment, the printing head 260 may move while spraying solution in which the light emitting elements LD may be dispersed onto the base substrate 100 seated on the stage 230, as an example, at least one cell 110A located or disposed on the base substrate 100 (for example, each pixel area defined in the cell 110A) may be in the form of the droplet DRL.

Figure 11A:
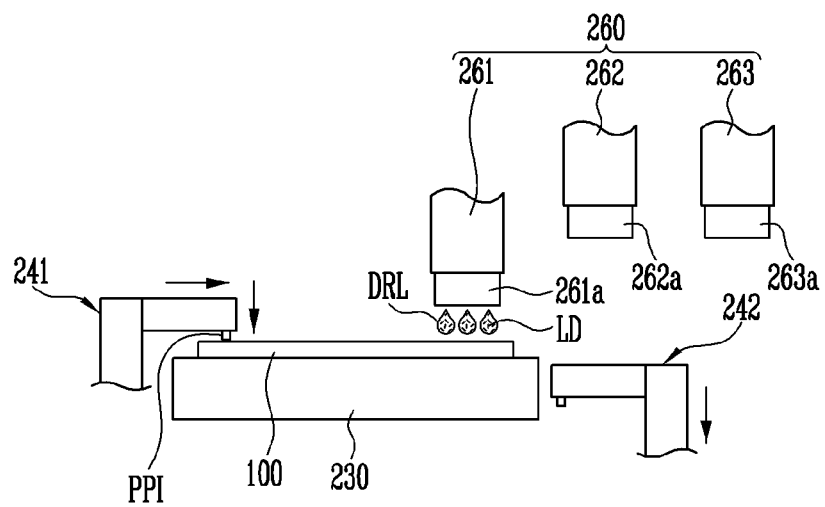
Figure 11B:
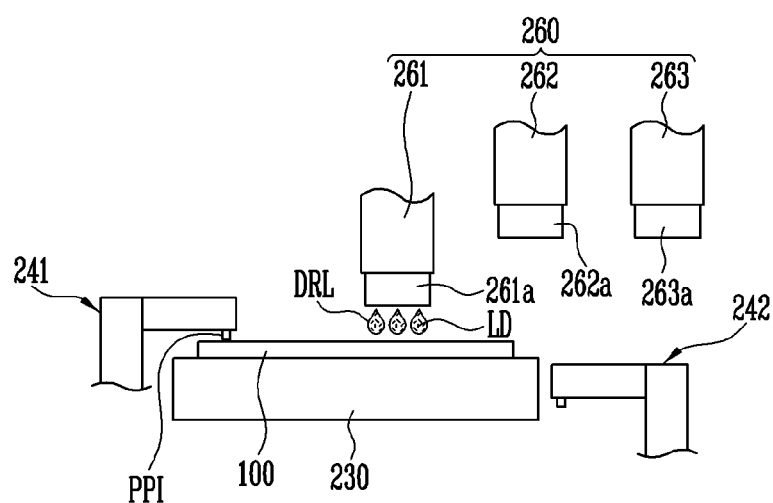

In an embodiment, in a case that the printing head 260 approaches the right side of the stage 230, the first electric-field application module 241 located or disposed on the left side of the stage 230, by way of example, the probe head PHD of the first electric-field application module 241 may move to the left side of the stage 230 above the stage 230. For example, as illustrated in FIGS. 11A and 11B, the first electric-field application module 241 may apply the electric field to the base substrate 100 above the left side of the stage 230, during a period in a case that the printing head 260 (for example the first printing head 261) that may be operated may be located or disposed above the right side of the stage 230. For instance, the first electric-field application module 241 may apply a predetermined alignment voltage through the conductive pads 102 located or disposed on the left side of the base substrate 100 to the cells 110A located or disposed on the right side of the base substrate 100. Meanwhile, during this period, the second electric-field application module 242 may wait in a state in which it moves backwards and downwards relative to the stage 230.

Figure 11C:
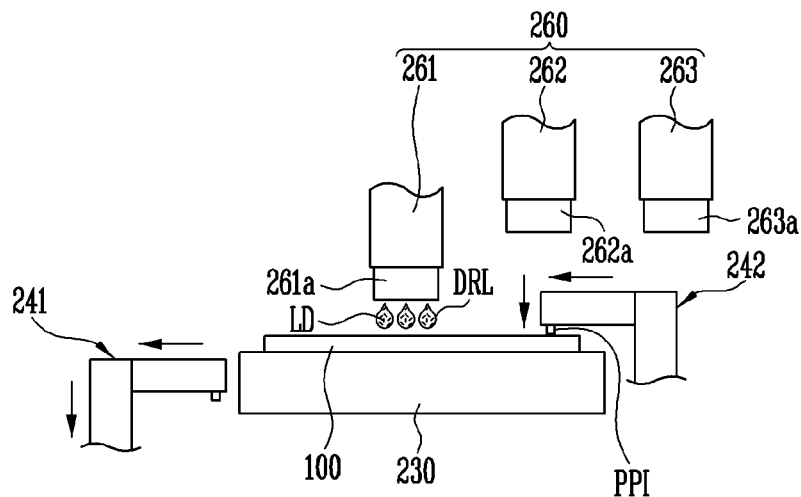
Figure 11D:
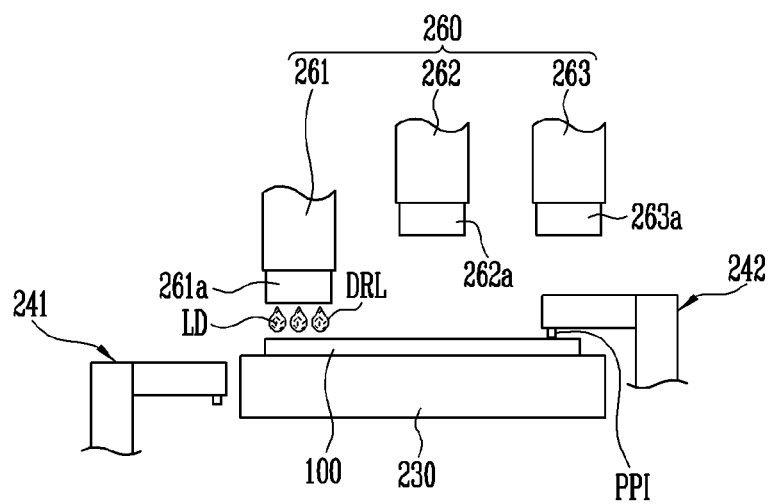

Meanwhile, in a case that the printing head 260 approaches the left side of the stage 230, the second electric-field application module 242 located or disposed on the right side of the stage 230, for example the probe head PHD of the second electric-field application module 242 may move to the right side of the stage 230 above the stage 230. For example, as illustrated in FIGS. 11C and 11D, the second electric-field application module 242 may apply the electric field to the base substrate 100 above the right side of the stage 230, during a period in a case that the printing head 260 that may be operated may be located or disposed above the left side of the stage 230. For instance, the second electric-field application module 242 may apply a predetermined alignment voltage through the conductive pads 102 located or disposed on the right side of the base substrate 100 to the cells 110A located or disposed on the left side of the base substrate 100. Meanwhile, during this period, the first electric-field application module 241 may wait in a state in which it moves backwards and downwards relative to the stage 230.

According to the above-described embodiment, the electric field may be applied by driving at least one printing head 260 to supply the light emitting elements LD onto the base substrate 100, and simultaneously driving at least one electric-field application module 240 to align the light emitting elements LD on the base substrate 100. For example, in the above-described embodiment, interference and/or collision between the printing head 260 and the electric-field application module 240 may be prevented, by optionally driving the first and/or second electric-field application modules 241 and 242 depending on the position of the printing head 260 that may be operated. Thus, it may be possible to increase the moving distance of the printing head 260 and sufficiently secure an effective area (for example, area in which individual cells 110A may be disposed) that may supply the light emitting elements LD on the base substrate 100.

Figure 12:
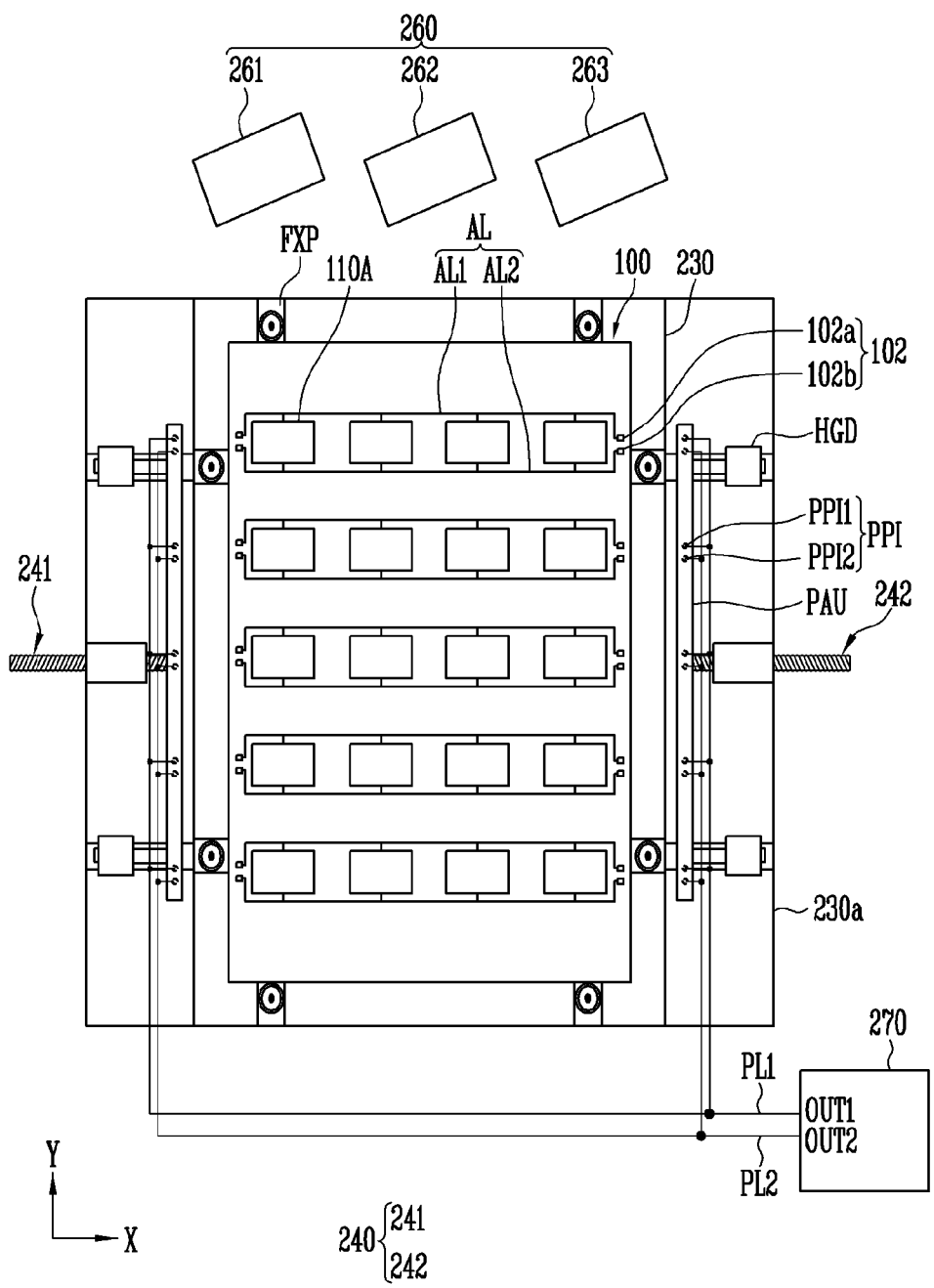
FIGS. 12 and 13 are diagrams illustrating an embodiment of a method of driving the manufacturing apparatus of FIG. 6.
Figure 13:
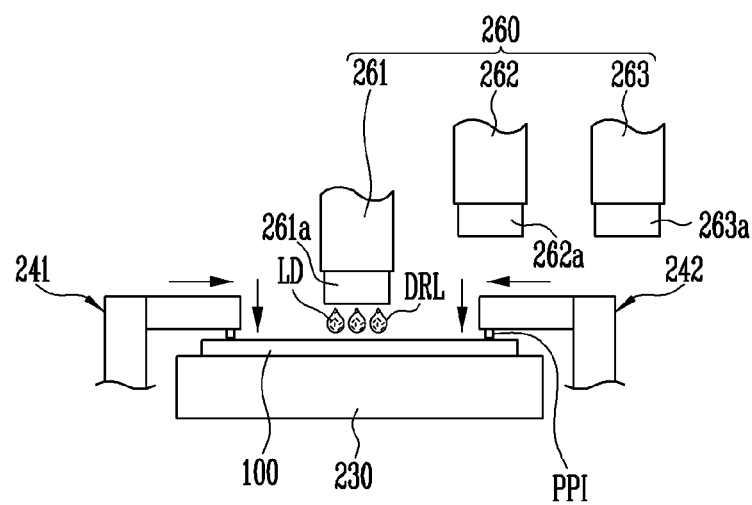

FIGS. 12 and 13 are diagrams illustrating an embodiment of a method of driving the manufacturing apparatus 200A of FIG. 6. In an embodiment of FIGS. 12 to 13, like reference numerals are used to designate identical or similar components as those of the embodiments of FIGS. 10 to 11D, and detailed descriptions thereof will be omitted.

Referring to FIGS. 12 and 13, according to an embodiment, the first and second electric-field application modules 241 and 242 may be simultaneously driven. For example, the first and second electric-field application modules 241 and 242 may be independently and/or individually driven, and may be simultaneously driven if necessary.

For instance, in a case that the first and second alignment lines AL1 and AL2 are simultaneously electrically coupled or electrically connected to the conductive pads 102 disposed on the left and right sides of the base substrate 100, the first and second electric-field application modules 241 and 242 may be simultaneously driven to apply a predetermined electric field through both ends of the base substrate 100. In this case, by reducing or minimizing a voltage drop occurring in the first and second alignment lines AL1 and AL2, the light emitting elements LD may be smoothly aligned in each cell 110A.

Alternatively, in an embodiment, each cell 110A may be electrically coupled or electrically connected to at least one pair of closest conductive pads 102 among the conductive pads 102 disposed on both sides of the base substrate 100, and may receive a predetermined voltage from at least one pair of conductive pads 102 during the period in a case that the light emitting elements LD may be supplied to the interior of the cell 110A. For example, the cells 110A disposed on the left side of the base substrate 100 may receive a predetermined voltage from the conductive pads 102 disposed on a left edge of the base substrate 100, and the cells 110A disposed on the right side of the base substrate 100 may receive a predetermined voltage from the conductive pads 102 disposed on a right edge of the base substrate 100. Even in this case, by reducing or minimizing a voltage drop occurring in the first and second alignment lines AL1 and AL2, the light emitting elements LD may be smoothly aligned in each cell 110A.

Figure 14:
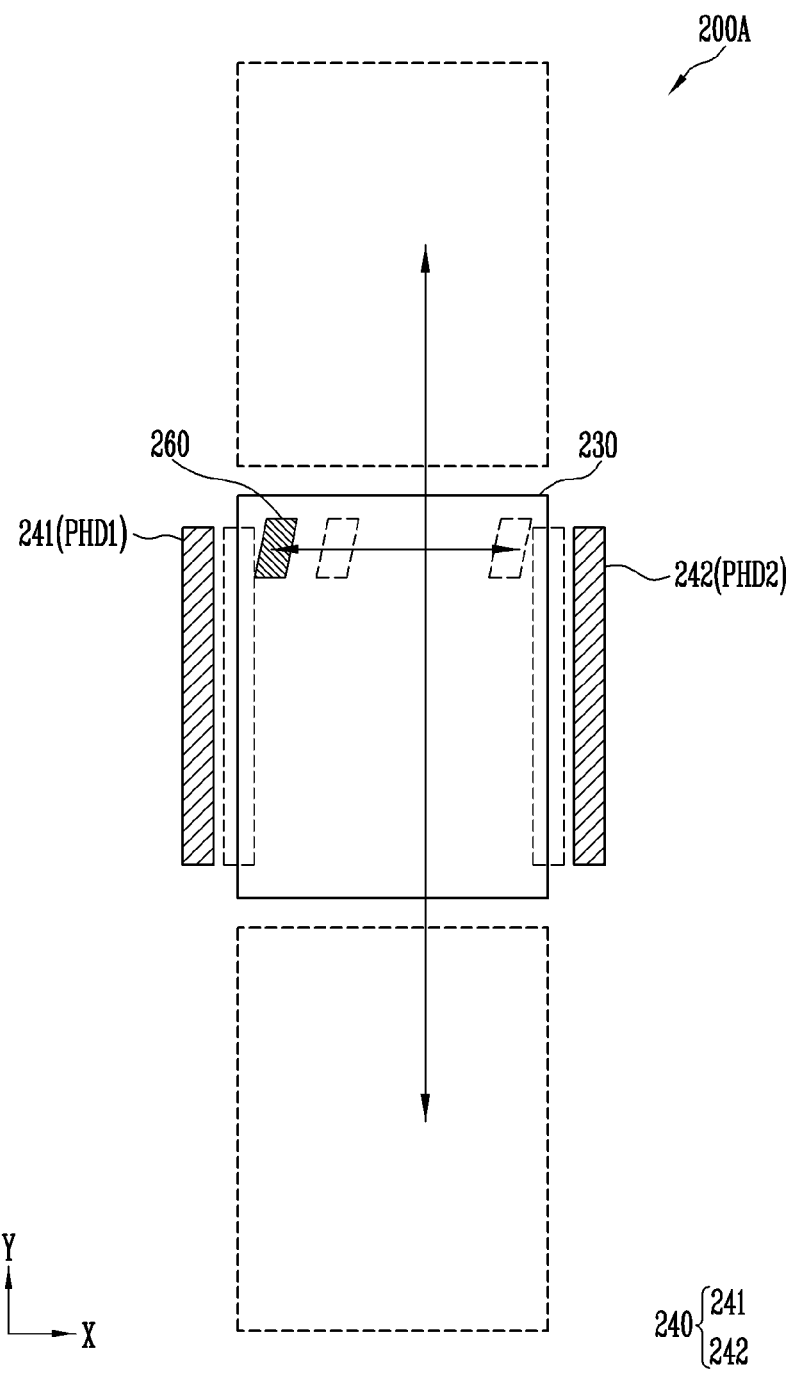
FIGS. 14 to 16 are diagrams illustrating various embodiments related to the arrangement of the electric-field application module that may be provided or disposed in the manufacturing apparatus of FIG. 6.
Figure 15:
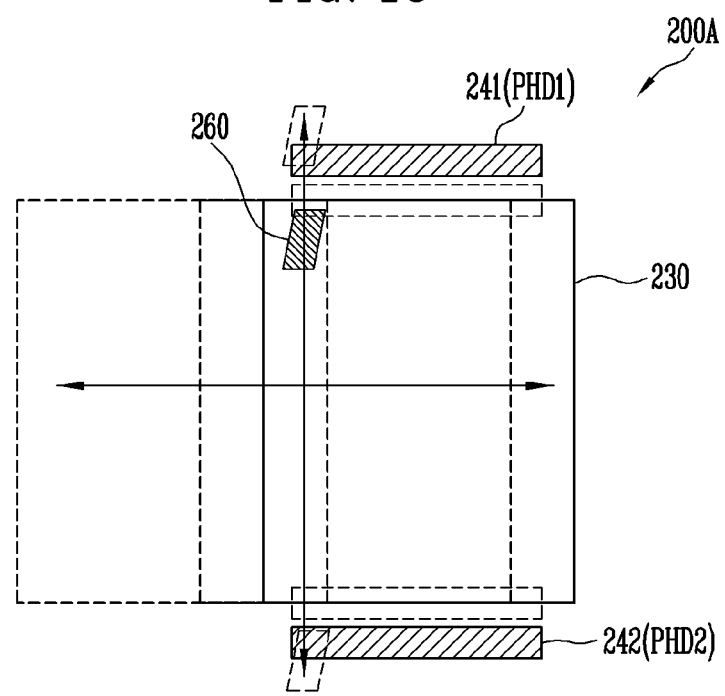
Figure 16:
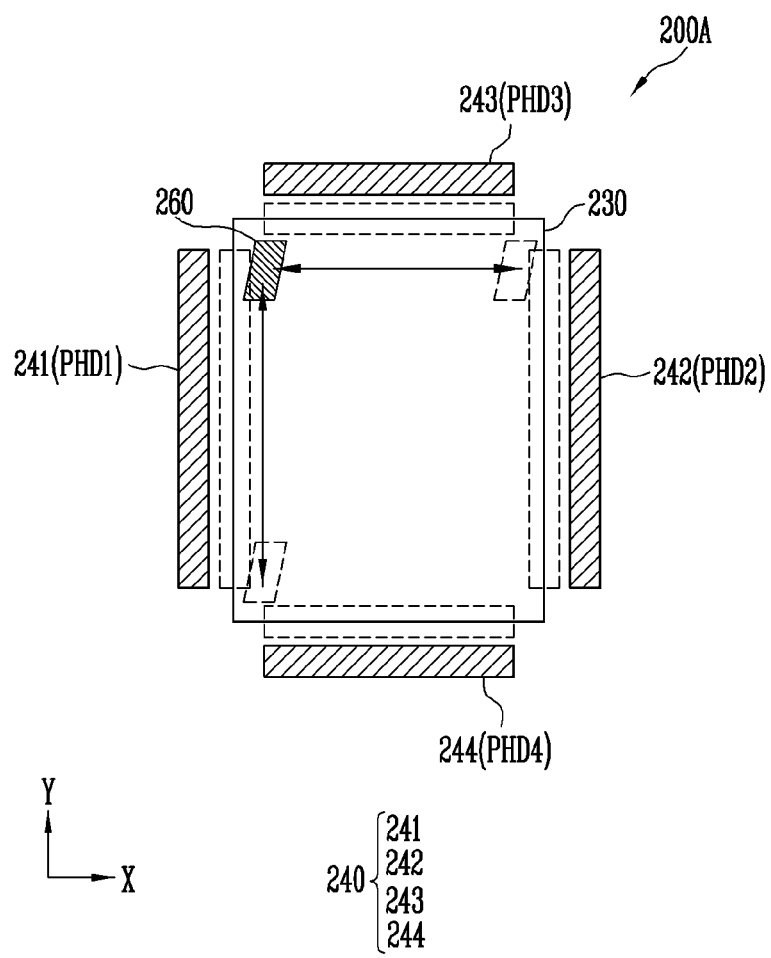
Figure 17A:
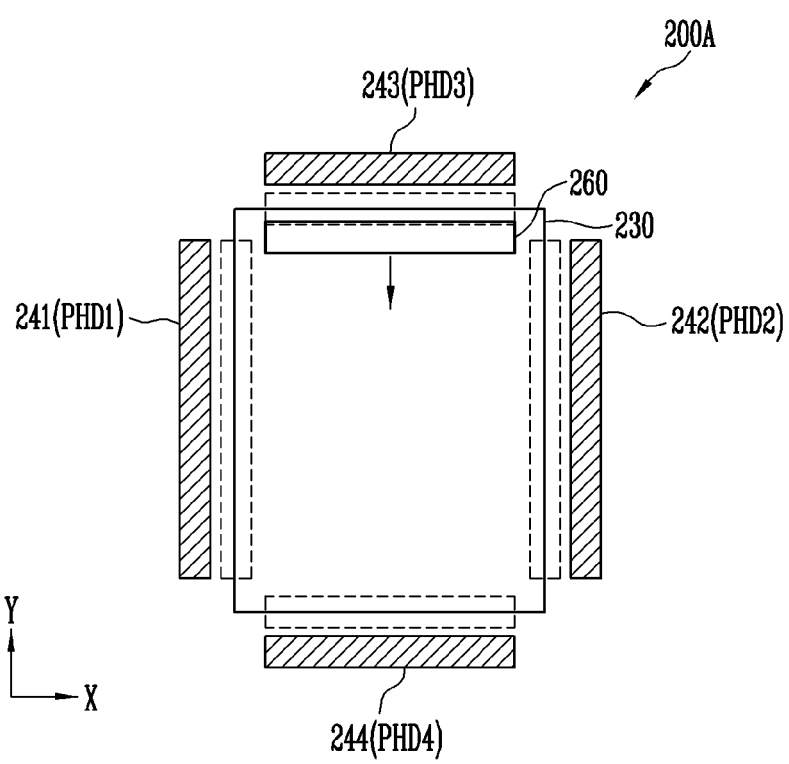
FIGS. 17A and 17B are diagrams illustrating various embodiments related to a printing head that may be provided or disposed in the manufacturing apparatus of FIG. 6.
Figure 17B:
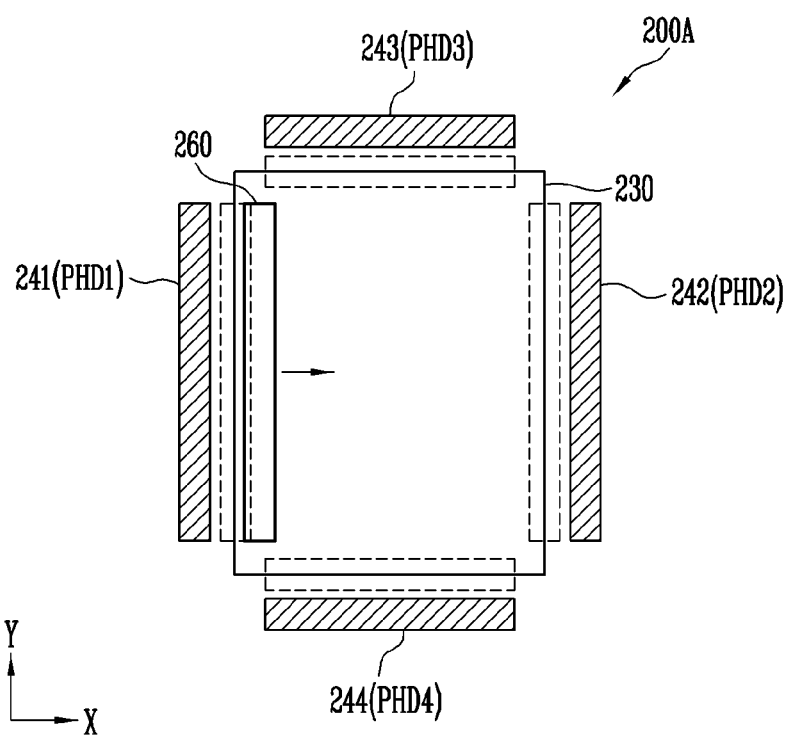

FIGS. 14 to 16 are diagrams illustrating various embodiments related to the arrangement of the electric-field application module 240 that may be provided or disposed in the manufacturing apparatus 200A of FIG. 6. FIGS. 17A and 17B are diagrams illustrating various embodiments related to the printing head 260 that may be provided or disposed in the manufacturing apparatus 200A of FIG. 6. FIGS. 14 to 17B schematically illustrate only the position of the electric-field application module 240 depending on the position and/or moving direction of the stage 230 and the printing head 260.

Referring to FIG. 14, in an embodiment, the stage 230 and the printing head 260 may move in directions orthogonal to each other. For instance, in the manufacturing apparatus 200A adopting a stage moving method, the stage 230 may move in a large width along the Y-axis direction, and the printing head 260 may move in a relatively small width along the X-axis direction. Thus, the light emitting elements LD may be supplied to an entire effective area on the stage 230. In this embodiment, the first and second electric-field application modules 241 and 242 may be disposed on the left and right sides of the stage 230 so as not to interfere with the movement of the stage 230. Thus, even in a case that the stage 230 moves in the large width along the Y-axis direction, it is possible to prevent the stage 230 from colliding with the first and second electric-field application modules 241 and 242, for example the probe heads PHD1 and PHD2 of the first and second electric-field application modules 241 and 242. As in the above-described embodiment, the first and second electric-field application modules 241 and 242 may be driven to prevent collision with the printing head 260.

Referring to FIG. 15, for instance, in the manufacturing apparatus 200A adopting the head moving method, the stage 230 may move in a relatively large width along the X-axis direction, and the printing head 260 may move along the Y-axis direction. In this embodiment, the first and second electric-field application modules 241 and 242 may be disposed on the upper and lower ends of the stage 230 so as not to interfere with the movement of the stage 230.

Referring to FIG. 16, in an embodiment, the electric-field application module 240 may be disposed on at least three sides of the stage 230. For instance, the electric-field application module 240 may be disposed on all four sides of the stage 230. For instance, the manufacturing apparatus 200A according to this embodiment may include a third electric-field application module 243 disposed on the third side of the stage 230, for example, its upper end, and a fourth electric-field application module 244 disposed on the fourth side of the stage 230, for example, its lower end. In an embodiment, the respective electric-field application modules 240 may have the substantially same configuration, so that the two electric-field application modules 240 may be disposed to face each other. Each electric-field application module 240 may be driven to prevent the respective probe heads PHD1, PHD2, PHD3, and PHD4 from colliding with the stage 230 and/or the printing head 260.

In an embodiment of FIG. 16, the printing head 260 may be designed to move along the X-axis and Y-axis directions. Alternatively, in an embodiment, the printing head 260 may be designed to move in a direction crossing or intersecting a longitudinal direction while having an extended length along the X-axis or Y-axis direction as illustrated in FIGS. 17A and 17B.

According to the above-described embodiments, it is possible to smoothly supply the light emitting elements LD to the effective area on the stage 230 and simultaneously apply the electric field for aligning the light emitting elements LD, while preventing mutual interference and/or collision between the stage 230, the electric-field application module 240 and/or the printing head 260.

The apparatus 200A for manufacturing the light emitting display device according to the embodiments of FIGS. 6 to 17B may include the printing head 260 that may supply the light emitting elements LD, and the electric-field application module 240 that may align the light emitting elements LD. For example, the electric-field application module 240 may transmit a predetermined alignment voltage for inducing the self-alignment of the light emitting elements LD to the base substrate 100 (or the substrate 111 of the light emitting display panel 110). Thus, the light emitting elements LD may be supplied to the base substrate 100 (or, the substrate 111 of the light emitting display panel 110) seated on the stage 230 of the manufacturing apparatus 200A, and simultaneously the light emitting elements LD may be aligned between the first and second pixel electrodes ELT1 and ELT2 of each pixel PXL.

The electric-field application module 240 may include a first driver LA1 for horizontally moving the probe head PHD, and a second driver LA2 for vertically moving the probe head PHD. Thus, the movement of the electric-field application module 240 may be easily controlled.

In an embodiment, the manufacturing apparatus 200A may include electric-field application modules 240 that may be sequentially and/or simultaneously driven. According to this embodiment, the electric field may be smoothly applied to the base substrate 100 (or, the substrate 111 of the light emitting display panel 110), while preventing mutual interference and/or collision between the electric-field application module 240 and the printing head 260.

Figure 18:
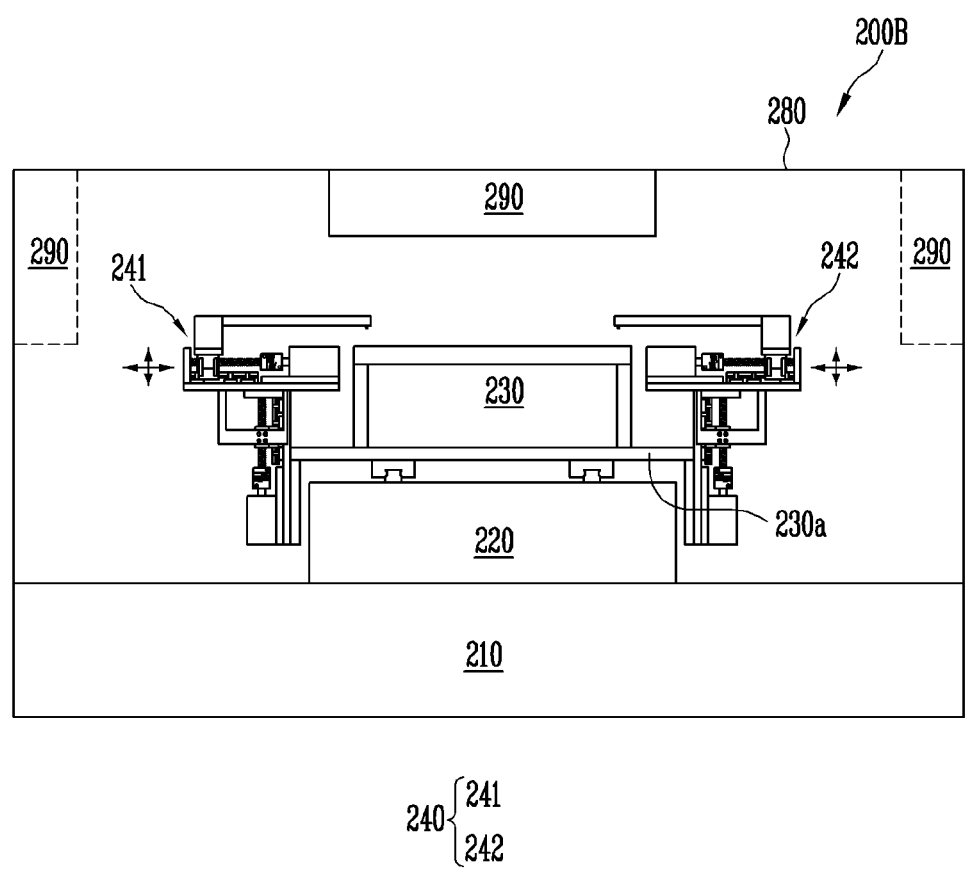
FIGS. 18 and 19 are diagrams illustrating an apparatus for manufacturing a light emitting display device in accordance with an embodiment.
Figure 19:
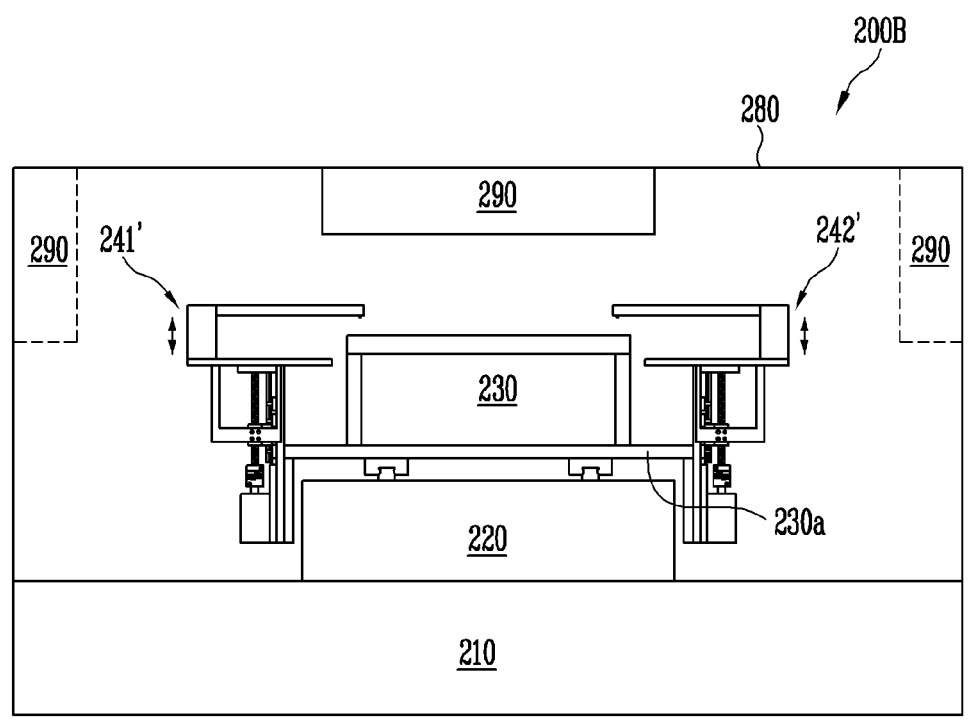

FIGS. 18 and 19 are diagrams illustrating an apparatus 200B for manufacturing a light emitting display device in accordance with an embodiment. In detail, FIGS. 18 and 19 illustrate the embodiment of the manufacturing apparatus 200B that may be used to remove solution supplied to the substrate 111 of the light emitting display panel 110 or the base substrate 100 along with the light emitting elements LD. For instance, the manufacturing apparatus 200B may emit heat for removing the solution supplied along with the light emitting elements LD in a process of supplying the droplet DRL containing the light emitting elements LD to the substrate 111 of the light emitting display panel 110 or the base substrate 100. According to an embodiment, the manufacturing apparatus 200B may be an oven type drying apparatus that may accommodate the substrate 111 of the light emitting display panel 110 or the base substrate 100, but is not limited thereto. The same or similar reference numerals will denote components common to the manufacturing apparatus 200B according to the embodiment of FIGS. 18 and 19 and the manufacturing apparatus 200A according to the embodiment of FIGS. 6 to 17B, and a detailed description thereof will be omitted.

Referring to FIGS. 18 and 19, the apparatus 200B for manufacturing the light emitting display device according to the embodiment may include the stage 230 disposed in the chamber 280, at least one electric-field application module 240, 240' disposed on at least one side of the stage 230, and a heating element 290 disposed around the stage 230. According to an embodiment, the manufacturing apparatus 200B may include a main plate 210 and/or an auxiliary plate 220.

According to an embodiment, the manufacturing apparatus 200B may include at least one of first electric-field application modules 241 and 241' disposed on a first side of the stage 230, and second electric-field application modules 242 and 242' disposed on a second side of the stage 230. In an embodiment, the first and second sides of the stage 230 may be opposite ends that face each other. For instance, the first side and the second side may be the left side and the right side of the stage 230, respectively. In other words, the first and second electric-field application modules 241, 241', 242, and 242' may be disposed to be adjacent to both sides of the stage 230 facing each other, respectively. However, the disclosure is not limited thereto, and the positions of the first and second electric-field application modules 241, 241', 242, and 242' may be changed. In an embodiment, a single electric-field application module 240 or 240' may be disposed only on any one side of the stage 230.

In an embodiment, the first and second electric-field application modules 241, 241', 242, and 242' may be driven independently or individually. Thus, the first and second electric-field application modules 241, 241', 242, and 242' may be easily selectively driven.

In an embodiment, the first and second electric-field application modules 241, 241', 242, and 242' may be driven simultaneously. Thus, a desired electric field may be smoothly supplied to the substrate 111 of the light emitting display panel 110 or the base substrate 100.

According to an embodiment, each of the electric-field application modules 240 and 240' may have the substantially same or similar configuration as the above-described embodiments. For instance, as illustrated in FIGS. 7 and 18, each electric-field application module 240 may include a probe head PHD having at least one probe pin PPI, first and second drivers LA1 and LA2 that may move the probe head PHD horizontally and vertically, and a body BD coupled or connected to the probe head PHD and the first and second drivers LA1 and LA2. According to an embodiment, each electric-field application module 240 may include at least one sensor unit (for example, first and/or second sensor unit SEU1 and SEU2) disposed around the first and/or second driver LA1, LA2 to detect the position of the probe head PHD, and at least one linear motion guide (for example, first and/or second linear motion guide LM1, LM2) coupled or connected to the body BD. In an embodiment, the first driver LA1 may horizontally move the probe head PHD forwards and backwards or leftwards and rightwards, and the second driver LA2 may vertically move the probe head PHD up and down. Thus, the movement of the electric-field application module 240 may be easily controlled.

Meanwhile, according to an embodiment, each electric-field application module 240' may vertically move up and down, as illustrated in FIG. 19. For instance, each of the first and second electric-field application modules 241' and 242' may not be provided with the first driver LA1 for horizontally moving the probe head PHD, and may be provided with only the second driver LA2 for vertically moving the probe head PHD. In this case, each probe head PHD may vertically move up and down.

The manufacturing apparatus 200B may include a device that may supply a predetermined voltage to each of the electric-field application modules 240 and 240', for instance, the power supply 270 illustrated in FIG. 10. For example, as illustrated in FIG. 10, the probe head PHD may include at least one first probe pin PPI1 electrically coupled or electrically connected to the first power line PL1 (for example, first probe pins PPI1 electrically coupled or electrically connected in common to the first power line PL1), and at least one second probe pin PPI2 electrically coupled or electrically connected to the second power line PL2 (for example, second probe pins PPI2 paired with the first probe pins PPI1, respectively, and electrically coupled or electrically connected in common to the second power line PL2). The power supply 270 may be electrically coupled or electrically connected to at least one first and second probe pins PPI1 and PPI2 via the first and second power lines PL1 and PL2, respectively. According to an embodiment, the power supply 270 may supply an AC or DC signal through the first power line PL1 to at least one first probe pin PPI1, and may supply a reference voltage having a predetermined reference potential through the second power line PL2 to at least one second probe pin PPI2.

In an embodiment, the heating element 290 may be disposed above the stage 230 to be spaced apart from the stage 230. For instance, the heating element 290 may be disposed on a ceiling of the chamber 280 to emit heat towards the stage 230. In an embodiment, the shape, size, structure and/or material of the heating element 290 are not limited particularly. The heating element 290 may include various heating materials within the spirit and the scope of the disclosure.

In an embodiment, the position of the heating element 290 may be changed. For example, in an embodiment, at least one heating element 290 may be disposed on at least one corner and/or at least one sidewall of the chamber 280.

Figure 20A:
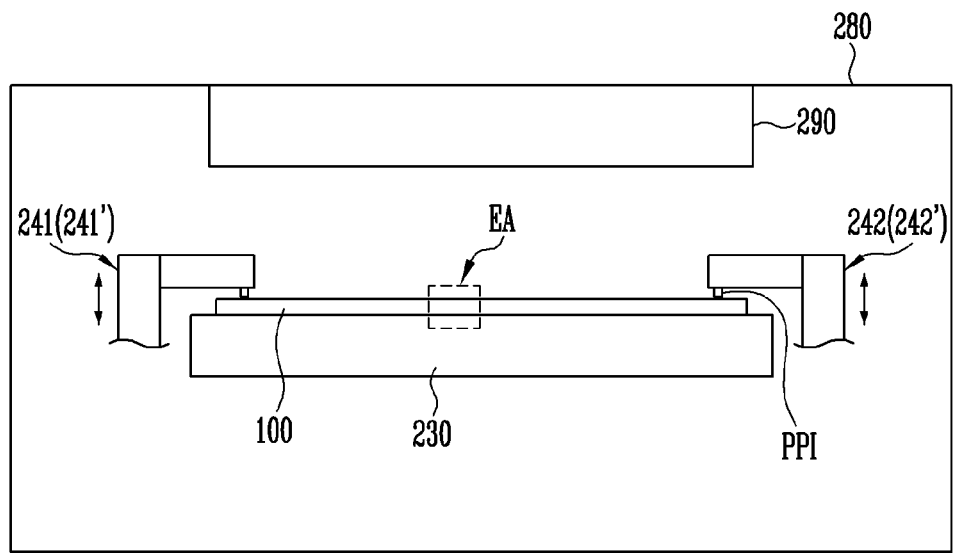
FIG. 20A is a diagram illustrating an embodiment of a method of driving the manufacturing apparatus of FIGS. 18 and 19.
Figure 20B:
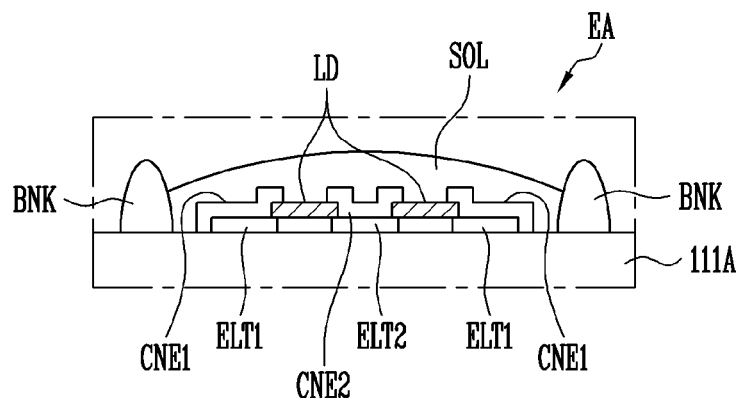
FIG. 20B is a diagram illustrating an embodiment of one area (area EA) of FIG. 20A.

FIG. 20A is a diagram illustrating an embodiment of a method of driving the manufacturing apparatus 200B of FIGS. 18 and 19. FIG. 20B is a diagram illustrating an embodiment of one area (area EA) of FIG. 20A. In an embodiment, the area EA of FIG. 20A may be the light emitting area of each pixel PXL. In the description of the embodiment of FIGS. 20A and 20B, like reference numerals will be used to designate components similar or equal to those of the previous embodiments, and detailed explanation thereof will be omitted.

Referring to FIGS. 20A and 20B, in a case that the light emitting elements LD may be supplied to each cell 110A of the base substrate 100 through the above-described printing method, solvent SOL of the LED solution as well as the light emitting elements LD may be supplied to each pixel area defined in each cell 110A, for example, the light emitting area EA of each pixel PXL enclosed by the bank BNK. Therefore, after the light emitting elements LD may be supplied to each light emitting area EA, the solvent SOL may be removed and the light emitting elements LD may be stably disposed between the first and second pixel electrodes ELT1 and ELT2.

In an embodiment, the solvent SOL may be removed using the apparatus 200B for manufacturing the light emitting display device according to the embodiment of FIGS. 18 and 19, for instance, the oven type drying apparatus having the heating element 290. For instance, in a state where the electric field is formed on the base substrate 100 seated on the stage 230 using at least one electric-field application module 240, 240', the heating element 290 may be driven to remove the solvent SOL supplied to the base substrate 100.

For example, the first and second electric-field application modules 241, 241', 242, and 242' may move up and down to cause the probe pins PPI to come into the conductive pads 102 on the base substrate 100, and may apply a predetermined alignment voltage to the conductive pads 102. Thus, in a state where the alignment voltage is applied to the first and second pixel electrodes ELT1 and ELT2 of each pixel PXL, the heating element 290 may be driven to supply heat to the base substrate 100 and thereby remove the solvent SOL.

As such, in a case that the solvent SOL is removed in a state where the alignment voltage is applied to the first and second pixel electrodes ELT1 and ELT2 of each pixel PXL, the misalignment of the light emitting elements LD may be prevented in the process of removing the solvent SOL. For example, even in a case that the flow or vapor of the solvent SOL occurs in a case that the solvent SOL is dried, the movement and/or removal of the light emitting elements LD may be prevented by the electric field formed between the first and second pixel electrodes ELT1 and ELT2 by the alignment voltage. Thus, the light emitting elements LD may be stably aligned in the light emitting area EA of each pixel PXL, and the quality of the alignment may be improved.

Figure 21:
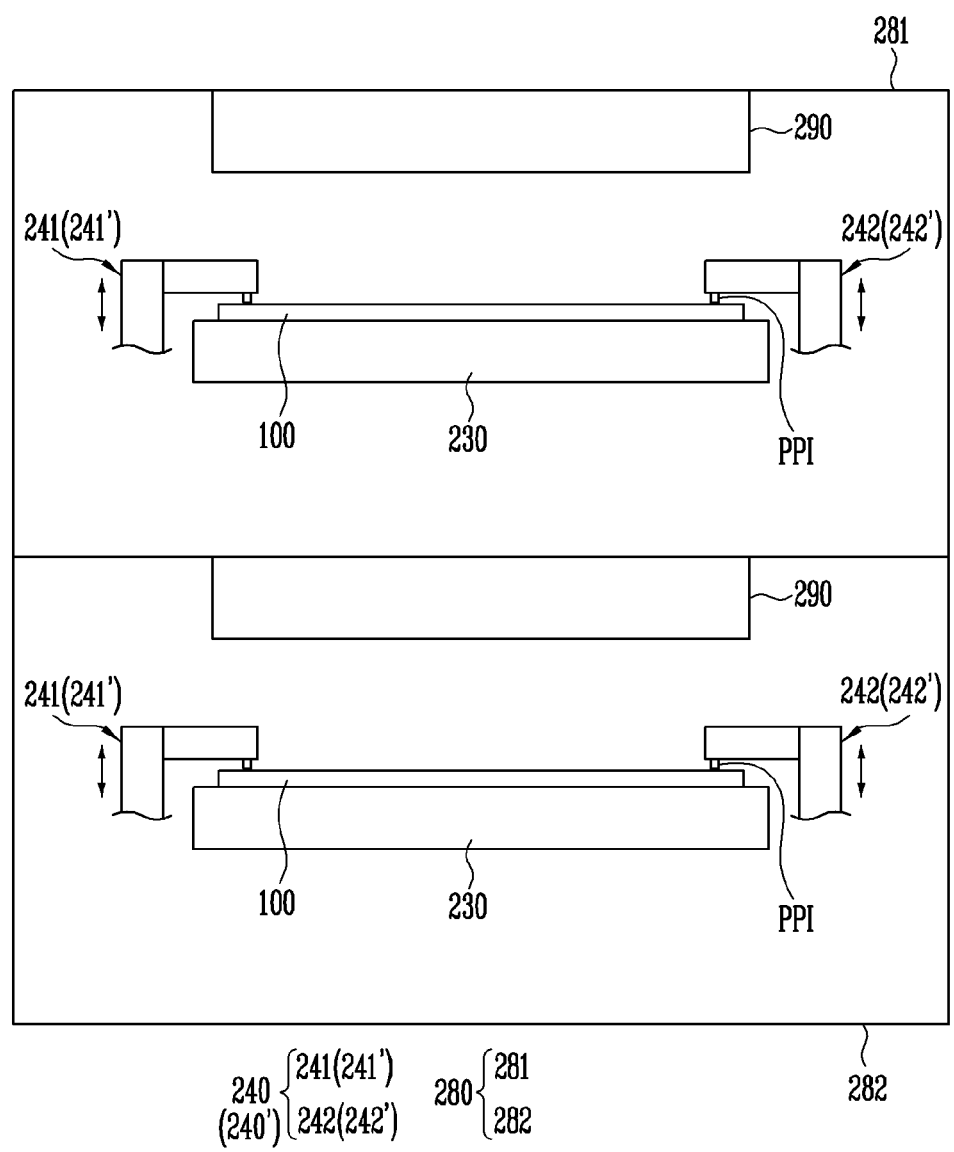
FIG. 21 is a diagram illustrating an embodiment of a method of driving the manufacturing apparatus of FIGS. 18 and 19.

FIG. 21 is a diagram illustrating an embodiment of a method of driving the manufacturing apparatus 200B of FIGS. 18 and 19. In the description of the embodiment of FIG. 21, like reference numerals will be used to designate components similar or equal to those of the previous embodiments, and detailed explanation thereof will be omitted.

Referring to FIGS. 20A, 20B, and 21, according to an embodiment, the process for drying the solvent SOL may be simultaneously performed on the base substrates 100, in the chambers 280, for example, at least in first and second chambers 281 and 282. Meanwhile, in the description of the embodiment according to the disclosure, an example in which the light emitting display panels 110 is simultaneously manufactured on at least one base substrate 100 has been described, but the disclosure is not limited thereto. For example, in an embodiment, an individual substrate 111 for manufacturing an individual light emitting display panel 110 may be disposed on the stage 230, and the process of supplying the light emitting elements LD and/or the process of drying the solvent SOL may be performed on the substrate 111.

Figure 22:
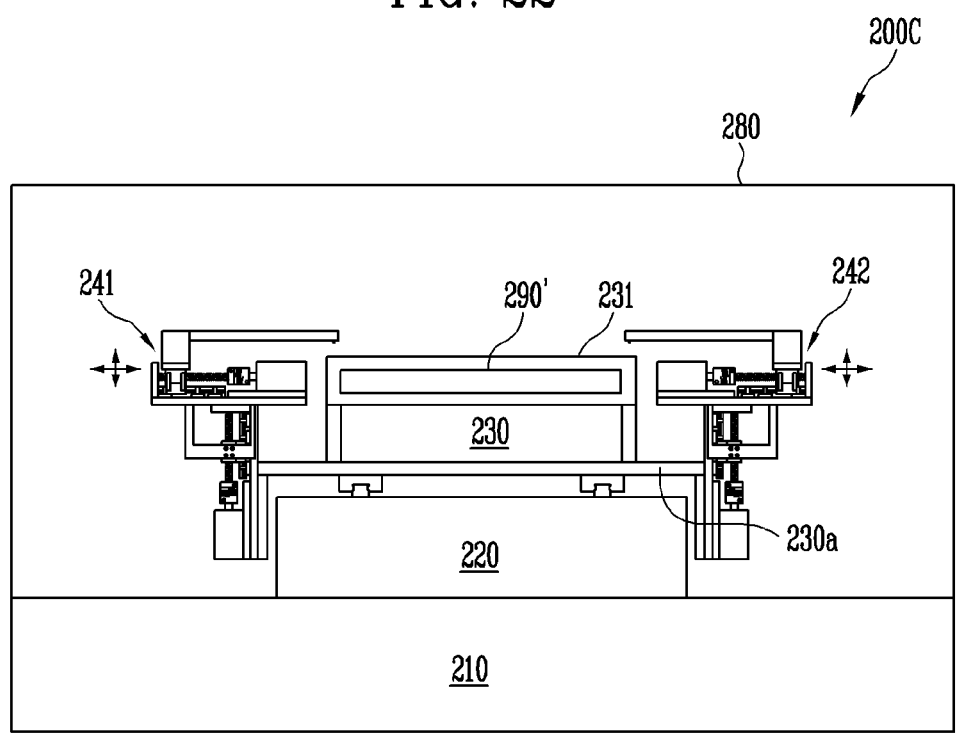
FIGS. 22 and 23 are diagrams illustrating an apparatus for manufacturing a light emitting display device in accordance with an embodiment.
Figure 23:
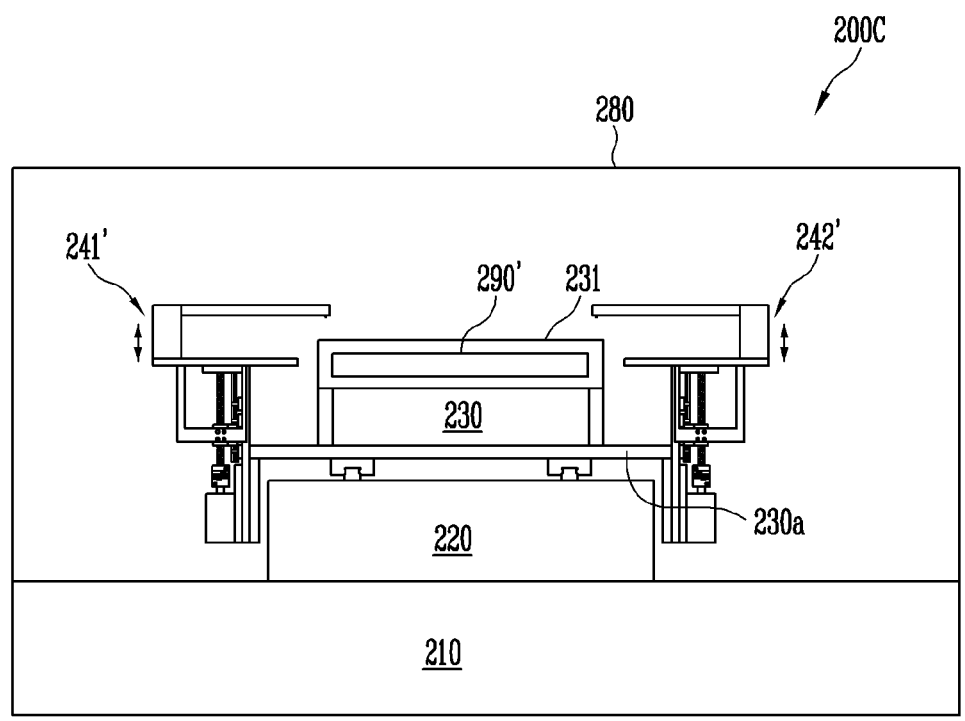
Figure 24:
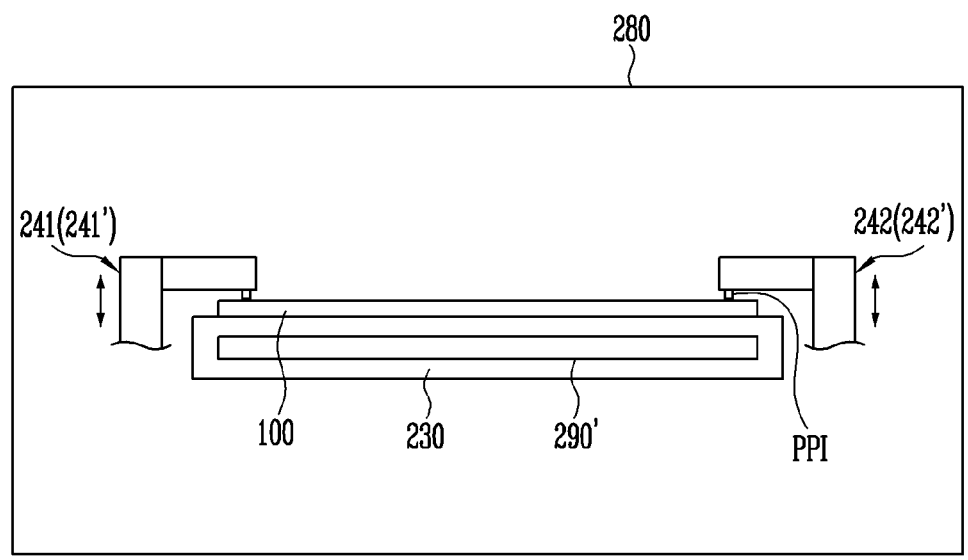
FIG. 24 is a diagram illustrating an embodiment of a method of driving the manufacturing apparatus of FIGS. 22 and 23.

FIGS. 22 and 23 are diagrams illustrating an apparatus 200C for manufacturing a light emitting display device in accordance with an embodiment. FIG. 24 is a diagram illustrating an embodiment of a method of driving the manufacturing apparatus 200C of FIGS. 22 and 23. In detail, FIGS. 22 and 23 illustrate the embodiment of the manufacturing apparatus 200C that may be used to remove solution supplied to the substrate 111 of the light emitting display panel 110 or the base substrate 100 along with the light emitting elements LD, and FIG. 24 illustrates the embodiment of the method of drying the solvent SOL using the manufacturing apparatus 200C. In an embodiment, the manufacturing apparatus 200C in accordance with the embodiments of FIGS. 22 to 24 may be a hot plate type of drying apparatus that may apply heat to the substrate 111 of the light emitting display panel 110 or the base substrate 100. In the following description of the embodiment of FIGS. 22 to 24, components similar or equal to those of the previously described embodiments, for example, the embodiment shown in FIGS. 18 and 20B, will be designated by like reference numerals, and detailed descriptions thereof will be omitted.

Referring to FIGS. 22 and 23, the apparatus 200C for manufacturing the light emitting display device in accordance with an embodiment may include a heating element 290' that may be disposed in the stage 230. For instance, the stage 230 may be provided with a hot plate 231 including the heating element 290'. In an embodiment, the hot plate 231 may be disposed on an upper end of the stage 230, but the position of the hot plate 231 is not limited thereto.

Referring to FIG. 24, the solvent SOL supplied to the base substrate 100 may be removed by driving the heating element 290' while applying a predetermined alignment voltage to the base substrate 100 (or the individual substrate 111 of the light emitting display panel 110) seated on the stage 230 using at least one electric-field application module 240, 240'. Thus, the light emitting elements LD may be stably aligned on the base substrate 100, and the quality of the alignment may be improved.

The manufacturing apparatuses 200B and 200C of the light emitting display device in accordance with the embodiments of FIGS. 18 to 24 include the electric-field application module 240 as well as the heating elements 290 and 290'. Thus, a predetermined alignment voltage may be supplied to the substrate 111 of the light emitting display panel 110 or the base substrate 100 seated on the stage 230 of the manufacturing apparatus 200B, 200C, thus preventing the removal of the light emitting elements LD and removing the solvent SOL of the LED solution.

Meanwhile, in the embodiments of FIGS. 6 to 24, the manufacturing apparatus 200A having the printing head 260 for supplying the light emitting elements LD, and the manufacturing apparatuses 200B and 200C having the heating elements 290 and 290' for drying the solvent SOL are illustrated and described in separate configurations, but the disclosure is not limited thereto. For example, in an embodiment, it may be possible to make a manufacturing apparatus by at least partially combining the features of the above-described manufacturing apparatuses 200A, 200B, and 200C. For instance, it may be possible to make the apparatus for manufacturing the light emitting display device having the printing head 260, the heating element 290, 290', and at least one electric-field application module 240, 240', by combining at least some of the embodiments of FIGS. 6 to 24.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

The invention claimed is:

1. An apparatus for manufacturing a light emitting display device, comprising:
   a stage comprising a first side opposing and facing a second side, and a third side opposing and facing a fourth side;
   at least one electric-field application module disposed on a corresponding at least one side of the stage and configured to supply an electric field to a substrate on the stage;
   at least one printing head disposed above the stage and configured to spray a light emitting component on a selected area of the substrate, wherein the printing head is movable; and
   a heating element disposed adjacent the stage and configured to heat a component applied to the substrate,
   wherein the at least one electric-field application module comprises:
   a probe head having at least one probe pin, and
   a driver connected to the probe head to move the probe head.

2. The apparatus according to claim 1, wherein the at least one electric-field application module comprises:
   a first electric-field application module disposed on the first side of the stage and configured to supply the corresponding electric field to the substrate; and
   a second electric-field application module disposed on the second side of the stage and configured to supply the corresponding electric field to the substrate, the second side of the stage facing the first side of the stage.

3. The apparatus according to claim 2, wherein the first electric-field application module and the second electric-field application module are configured to independently supply the respective electric fields to the substrate.

4. The apparatus according to claim 2, wherein the printing head is configured to spray a droplet onto the substrate on the stage while the printing head moves above the stage from the first side of the stage to the second side of the stage.

5. The apparatus according to claim 4, wherein the first electric-field application module and the second electric-field application module are configured to sequentially or alternately supply the respective electric fields to the substrate.

6. The apparatus according to claim 5, wherein
a probe head of the second electric-field application module is configured to supply the corresponding electric field to the substrate disposed on the stage while the printing head is located above the first side of the stage, and
a probe head of the first electric-field application module is configured to supply the corresponding electric field to the substrate while the printing head is located above the second side of the stage.

7. The apparatus according to claim 2, wherein the first electric-field application module and the second electric-field application module are configured to simultaneously supply the respective electric fields to the substrate.

8. The apparatus according to claim 2, wherein the at least one electric-field application module comprises at least one of:
a third electric-field application module disposed on the third side of the stage and configured to supply the corresponding electric field to the substrate; and
a fourth electric-field application module disposed on the fourth side of the stage and configured to supply the corresponding electric field to the substrate.

9. The apparatus according to claim 1, wherein the driver comprises:
a first driver configured to move the probe head forwards and backwards or leftwards and rightwards relative to the stage in a horizontal direction; and
a second driver configured to move the probe head up and down relative to the stage in a vertical direction.

10. The apparatus according to claim 9, wherein the at least one electric-field application module comprises at least one sensor configured to sense a position of the probe head.

11. The apparatus according to claim 10, wherein the at least one electric-field application module comprises:
a first sensor configured to sense a horizontal position of the probe head, the first sensor being disposed adjacent the first driver; and
a second sensor configured to sense a vertical position of the probe head, the second sensor being disposed adjacent the second driver.

12. The apparatus according to claim 11, wherein each of the first sensor and the second sensor comprises:
a first position sensor configured to sense a front limit or a rise limit of the probe head;
a second position sensor configured to sense a rear limit or a drop limit of the probe head; and
a third position sensor disposed between the first position sensor and the second position sensor and configured to sense whether the probe head reaches a predetermined target point or height.

13. The apparatus according to claim 9, wherein each of the first driver and the second driver comprises:
a motor; and
a ball screw connected to the motor.

14. The apparatus according to claim 1, wherein the probe head comprises:
a first probe pin electrically connected to a first power line; and
a second probe pin electrically connected to a second power line.

15. The apparatus according to claim 14, further comprising:
a power supply electrically connected to the first probe pin and the second probe pin through the first power line and the second power line.

16. The apparatus according to claim 15, wherein
the power supply is configured to supply an alternating current voltage through the first power line to the at least one first probe pin, and
the power supply is configured to supply a reference voltage having a predetermined reference potential through the second power line to the at least one second probe pin.

17. The apparatus according to claim 1, wherein the at least one printing head comprises printing heads, the printing heads configured to spray a solution in which different light emitting elements are dispersed onto the stage.

18. The apparatus according to claim 1, wherein the at least one electric-field application module further comprises:
a body connected to the probe head and the driver; and
a linear motion guide connected to the body.

19. The apparatus according to claim 1, wherein the stage comprises a hot plate including the heating element.

20. The apparatus according to claim 1, wherein the heating element is disposed above and spaced apart from the stage.

21. The apparatus according to claim 1, wherein the at least one electric-field application module is configured to supply the electric field simultaneously with the at least one printing head applying the light emitting component on the selected area of the substrate.

22. The apparatus according to claim 1, wherein the at least one electric-field application module is configured to supply the electric field sufficient to cause an alignment of the light emitting component on the selected area of the substrate.

23. The apparatus according to claim 1, wherein the driver is configured to move the probe head in direct contact with a selected area of the substrate.

* * * * *